US008199932B2

(12) United States Patent
Nakano

(10) Patent No.: US 8,199,932 B2
(45) Date of Patent: Jun. 12, 2012

(54) MULTI-CHANNEL, MULTI-BAND AUDIO EQUALIZATION

(75) Inventor: Kenji Nakano, Kanagawa (JP)

(73) Assignee: Sony Corporation, Tokyo (JP)

(*) Notice: Subject to any disclaimer, the term of this patent is extended or adjusted under 35 U.S.C. 154(b) by 1239 days.

(21) Appl. No.: 11/986,120

(22) Filed: Nov. 20, 2007

(65) Prior Publication Data

US 2008/0260170 A1 Oct. 23, 2008

(30) Foreign Application Priority Data

Nov. 29, 2006 (JP) ................................ 2006-322072

(51) Int. Cl.
*H03G 5/00* (2006.01)

(52) U.S. Cl. ............ 381/103; 381/59; 381/98; 381/102

(58) Field of Classification Search .................... 381/58, 381/59, 95, 96, 98, 101-103; 333/28 R; 700/94
See application file for complete search history.

(56) References Cited

U.S. PATENT DOCUMENTS 5,581,621 A 12/1996 Koyama et al.
7,206,648 B2 * 4/2007 Fujishita ........................ 700/94
7,483,540 B2 * 1/2009 Rabinowitz et al. .......... 381/103
2001/0020193 A1 * 9/2001 Teramachi et al. ............ 700/94
2004/0146170 A1 7/2004 Zint
2005/0135631 A1 * 6/2005 Yoshino .......................... 381/59
2005/0276425 A1 * 12/2005 Forrester et al. .............. 381/104
2006/0093159 A1 * 5/2006 Koh et al. ....................... 381/98
2006/0153391 A1 7/2006 Hooley et al.
2006/0153404 A1 7/2006 Gardner
2007/0133823 A1 6/2007 Nakano
2007/0230556 A1 10/2007 Nakano
2008/0089522 A1 * 4/2008 Baba et al. ...................... 381/17
2008/0189065 A1 8/2008 Asada et al.

(Continued)

FOREIGN PATENT DOCUMENTS

EP 0119645 A1 9/1984

(Continued)

OTHER PUBLICATIONS

Mueller, Swen et al.: "Transfer-Function Measurement with Sweeps," Journal of the Audio Engineering Society, Audio Engineering Society, Jun. 2001, pp. 443-471, vol. 49, No. 6, New York, New York.

(Continued)

*Primary Examiner* — Kimberly Nguyen
*Assistant Examiner* — Duy Nguyen
(74) *Attorney, Agent, or Firm* — Wolf, Greenfield & Sacks, P.C.

(57) ABSTRACT

A signal processing apparatus includes a plurality of equalizers configured to input an audio signal of a corresponding channel among audio signals of a plurality of channels and configured to perform at least gain adjustment on the basis of a set parameter, each of the equalizers being provided in such a manner as to correspond to an audio signal of one of the plurality of channels; a plurality of output sections configured to output each audio signal for each of the plurality of channels, the audio signal being processed by the equalizer; a measurement section configured to measure frequency-amplitude characteristics of the audio signal output from the output section; and a computation section configured to perform a computation process for correcting frequency-amplitude characteristics of an audio signal of each channel on the basis of the measurement result by the measurement section.

7 Claims, 14 Drawing Sheets

U.S. PATENT DOCUMENTS

2009/0125132 A1* 5/2009 Kawashima .................... 700/94

FOREIGN PATENT DOCUMENTS

| | | | |
|---|---|---|---|
| EP | 0898364 | A2 | 2/1999 |
| EP | 1786241 | A2 | 5/2007 |
| JP | 58-202619 | | 11/1983 |
| JP | 58-202619 | A | 11/1983 |
| JP | 03-006467 | A | 1/1991 |
| JP | 05-327656 | A | 12/1993 |
| JP | 08-047079 | | 2/1996 |
| JP | 08-047079 | A | 2/1996 |
| JP | 08-248077 | A | 9/1996 |
| JP | 08-292179 | A | 11/1996 |
| JP | 11-112254 | | 4/1999 |
| JP | 11-112254 | A | 4/1999 |
| JP | 2000-097762 | A | 4/2000 |
| JP | 2001-025100 | | 1/2001 |
| JP | 2001-025100 | A | 1/2001 |
| JP | 2001-212100 | A | 8/2001 |
| JP | 2001-212101 | A | 8/2001 |
| JP | 2001-217665 | | 8/2001 |
| JP | 2001-217665 | A | 8/2001 |
| JP | 2002-354599 | A | 12/2002 |
| JP | 2004-007245 | | 1/2004 |
| JP | 2004-007245 | A | 1/2004 |
| JP | 2005-175562 | | 6/2005 |
| JP | 2005-175562 | A | 6/2005 |
| JP | 2006-005902 | A | 1/2006 |
| JP | 2006-516373 | A | 6/2006 |
| WO | WO 2007/078254 | A2 | 7/2007 |

OTHER PUBLICATIONS

Small, Richard H.: “Measurement of Loudspeaker Amplitude Modulation Distorsion,” 114th Convention of the Audio Engineering Society, Mar. 2003, pp. 1-8, Amsterdam, The Netherlands.

* cited by examiner

MULTI-CHANNEL, MULTI-BAND AUDIO EQUALIZATION

CROSS REFERENCES TO RELATED APPLICATIONS

The present invention contains subject matter related to Japanese Patent Application JP 2006-322072 filed in the Japanese Patent Office on Nov. 29, 2006, the entire contents of which are incorporated herein by reference.

BACKGROUND OF THE INVENTION

1. Field of the Invention

The present invention relates to a signal processing apparatus for performing correction of frequency-amplitude characteristics on an input audio signal, to a signal processing method for use therewith, and to a recording medium having a program recorded thereon, the program being executed by the signal processing apparatus.

2. Description of the Related Art

In recent years, some AV (Audio Visual) amplifiers have been installed with an automatic sound-field correction function. The automatic sound-field correction function may contain a function of automatically correcting acoustic frequency-amplitude characteristics between a reproduction speaker and the position of a user. For performing such correction, an equalizer (EQ) may usually be used, and correction is performed by adjusting parameters of each EQ element. More specifically, correction is performed by adjusting parameters of each EQ element so that the characteristics approximates target frequency-amplitude characteristics (hereinafter referred to as “target characteristics”).

A method of correcting frequency-amplitude characteristics in an acoustic apparatus has been disclosed in Japanese Unexamined Patent Application Publication No. 8-047079.

SUMMARY OF THE INVENTION

Some audio reproduction systems are equipped with a plurality of channels as sound sources (a stereo system using Lch and Rch, a 5.1-ch surround system or the like), and it is considered that frequency-amplitude characteristics are corrected for each channel. However, when correction is performed for each channel, frequency-amplitude characteristics between channels may vary, and sounds that are output simultaneously from speakers do not become coherent.

For example, when audio signals are simultaneously output from right and left speakers of Rch and Lch, an ideal situation is that a clear sound image is perceived by a user at an intermediate position of the two speakers. However, when frequency-amplitude characteristics of audio that is output simultaneously from right and left speakers does not become coherent and vary, a user at a position intermediate between the two speakers perceives the audio as a sound field causing an uncomfortable feeling, such as a perceived sound image being blurred to become large. For this reason, there has been a demand for decreasing variations in the level of audio signals that are output simultaneously from a pair of right and left speakers.

Accordingly, in the present invention, in view of the above-described problems, a signal processing apparatus is configured as described below.

A signal processing apparatus according to an embodiment of the present invention includes: a plurality of equalizers configured to input an audio signal of a corresponding channel among audio signals of a plurality of channels and configured to perform at least gain adjustment on the basis of a set parameter, each of the equalizers being provided in such a manner as to correspond to an audio signal of one of the plurality of channels; a plurality of output sections configured to output each audio signal for each of the plurality of channels, the audio signal being processed by the equalizer; a measurement section configured to measure frequency-amplitude characteristics of the audio signal output from the output section; and a computation section configured to perform a computation process for correcting frequency-amplitude characteristics of an audio signal of each channel on the basis of the measurement result by the measurement section, wherein the computation section computes a parameter to be set to the equalizer of a first channel so that the frequency-amplitude characteristics for the first channel, which are measured by the measurement section, match predetermined target characteristics with regard to the first predetermined channel among the plurality of channels, computes frequency-amplitude characteristics obtained when the computed parameter is set to the equalizer of the first channel as target characteristic with regard to the other channels other than the first channel, and then computes a parameter to be set to the equalizer of the target channel so that the computed target characteristics match the frequency-amplitude characteristics of the target channel, which are measured by the measurement section.

According to the above-described configuration, frequency-amplitude characteristics are corrected using a particular channel among a plurality of channels, which is a reference, and frequency-amplitude characteristics of another channel are corrected using the corrected frequency-amplitude characteristics as target characteristics. Therefore, it is possible to suppress variations in frequency-amplitude characteristics between channels.

In the manner described above, according to the present invention, it is possible to decrease the difference in frequency-amplitude characteristics of audio output from the speaker of each channel. As a result, since distortion of a sound image can be suppressed, it is possible to generate a sound field that feels comfortable to the user.

DESCRIPTION OF THE PREFERRED EMBODIMENT

A preferred embodiment of the present invention will be described below.

Figure 1:
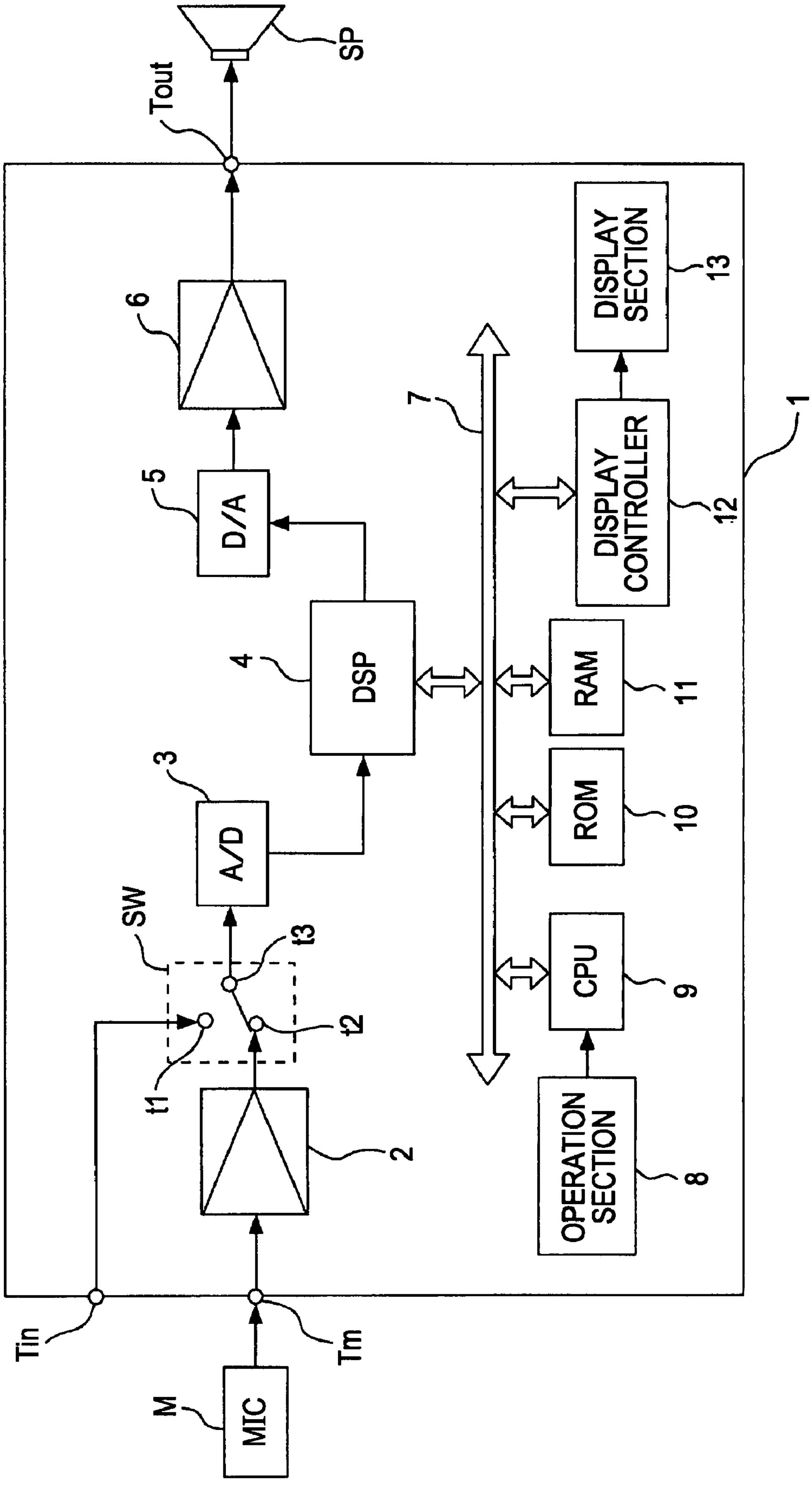
FIG. 1 is a block diagram showing the internal configuration of an AV amplifier configured to include a signal processing apparatus according to an embodiment of the present invention.

FIG. 1 shows the internal configuration of an AV (Audio Visual) amplifier 1 configured so as to include a signal processing apparatus as an embodiment of the present invention.

First, the AV amplifier 1 of the embodiment is configured to have an automatic sound-field correction function with which various kinds of sound-field correction, such as correction of frequency-amplitude characteristics, are automatically performed on the apparatus side.

Figure 2:
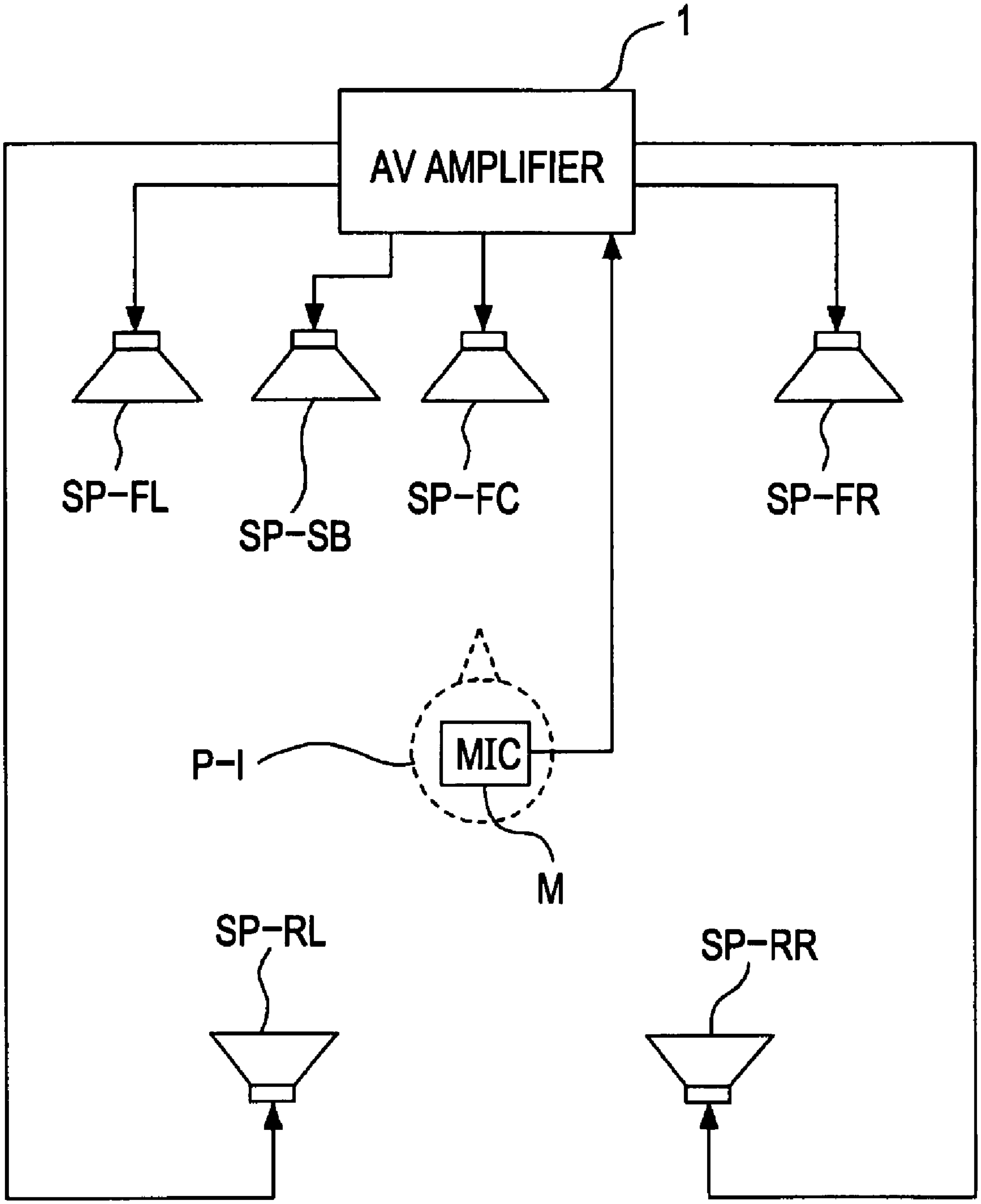
FIG. 2 shows the configuration of an AV system in which speakers and a microphone are combined to the AV amplifier according to the embodiment of the present invention.

The overview of an AV system for the purpose of realizing such an automatic sound-field correction function, the AV system including the AV amplifier 1, is shown in FIG. 2. In FIG. 2, a case in which an AV system is constructed on the basis of a 5.1-ch surround system is shown as an example. As shown in FIG. 1, a total of 6 speakers, that is, 5-ch speakers of a center front speaker SP-FC, a front right speaker SP-FR, a front left speaker SP-FL, a rear right speaker SP-RR, and a rear left speaker SP-RL, and a subwoofer SP-SB, are connected to the AV amplifier 1.

Furthermore, a microphone M necessary to measure acoustic characteristics is set at a listening position P-l, and this is connected to the AV amplifier 1.

The description returns to FIG. 1.

In FIG. 1, for the convenience of description, a total of 6 speakers SP (SP-FC, SP-FR, SP-FL, SP-RR, SP-RL, and SP-SB), shown in FIG. 2, are shown as one speaker SP. This speaker SP is connected to an audio output terminal Tout in the AV amplifier 1, as shown in FIG. 1. Furthermore, the microphone M shown in FIG. 2 is connected to a microphone input terminal Tm.

Furthermore, the AV amplifier 1 is provided with an audio input terminal Tin shown in the figure in addition to the microphone input terminal Tm so that audio signal input from the outside is made possible.

A switch SW is provided to switch input audio. This switch SW selects one of a terminal t1 and a terminal t2 with respect to a terminal t3 shown in the figure. The audio input terminal Tin is connected to the terminal t1, and the microphone input terminal Tm is connected to the terminal t2 via a microphone amplifier 2. An A/D converter 3 is connected to the terminal t3.

That is, as a result of the terminal t1 being selected, audio input from the outside via the audio input terminal Tin is made possible, and as a result of the terminal t2 being selected, audio input from the microphone M via the microphone input terminal Tm is made possible.

Although not shown in the figure, switching control for the switch SW is performed by a CPU 9 (to be described later) in such a manner that audio input from the microphone M is performed when acoustic characteristics are to be measured (in this case, in particular, frequency-amplitude characteristics are measured).

An audio signal that is converted into a digital signal by the A/D converter 3 is input to a DSP (Digital Signal Processor) 4.

The DSP 4 performs various kinds of audio signal processes on the input audio signal. For example, as an audio signal process, a process for providing various kinds of acoustic effects, such as a reverberation effect, is performed.

In the DSP 4 in this case, measurements of various kinds of acoustic characteristics necessary for an automatic sound-field correction, such as frequency-amplitude characteristics and a delay time between each speaker SP and the microphone M, are performed. Such measurements for acoustic characteristics are performed on the basis of the result obtained from a process in which a test signal such as, for example, a TSP (Time Stretched Pulse) signal, is output from a speaker SP and a detection signal obtained by the microphone M in response to the output of the test signal is analyzed.

The technology for measuring the above-described various kinds of acoustic characteristics (in particular, frequency-amplitude characteristics) on the basis of a detection signal from the microphone M is well known, and accordingly, a detailed description thereof is omitted herein.

In particular, the DSP 4 in this case is configured to be able to perform gain adjustment of an input signal for each of a plurality of frequency bands as a so-called equalizer function.

At this point, the equalizer function of the DSP 4 in this case is realized using a digital filter called an MPF (Mid Presence Filter). In this case, the function of each equalizer element (hereinafter also referred to as an "EQ element") is realized by software processing of the DSP 4.

Figure 3:
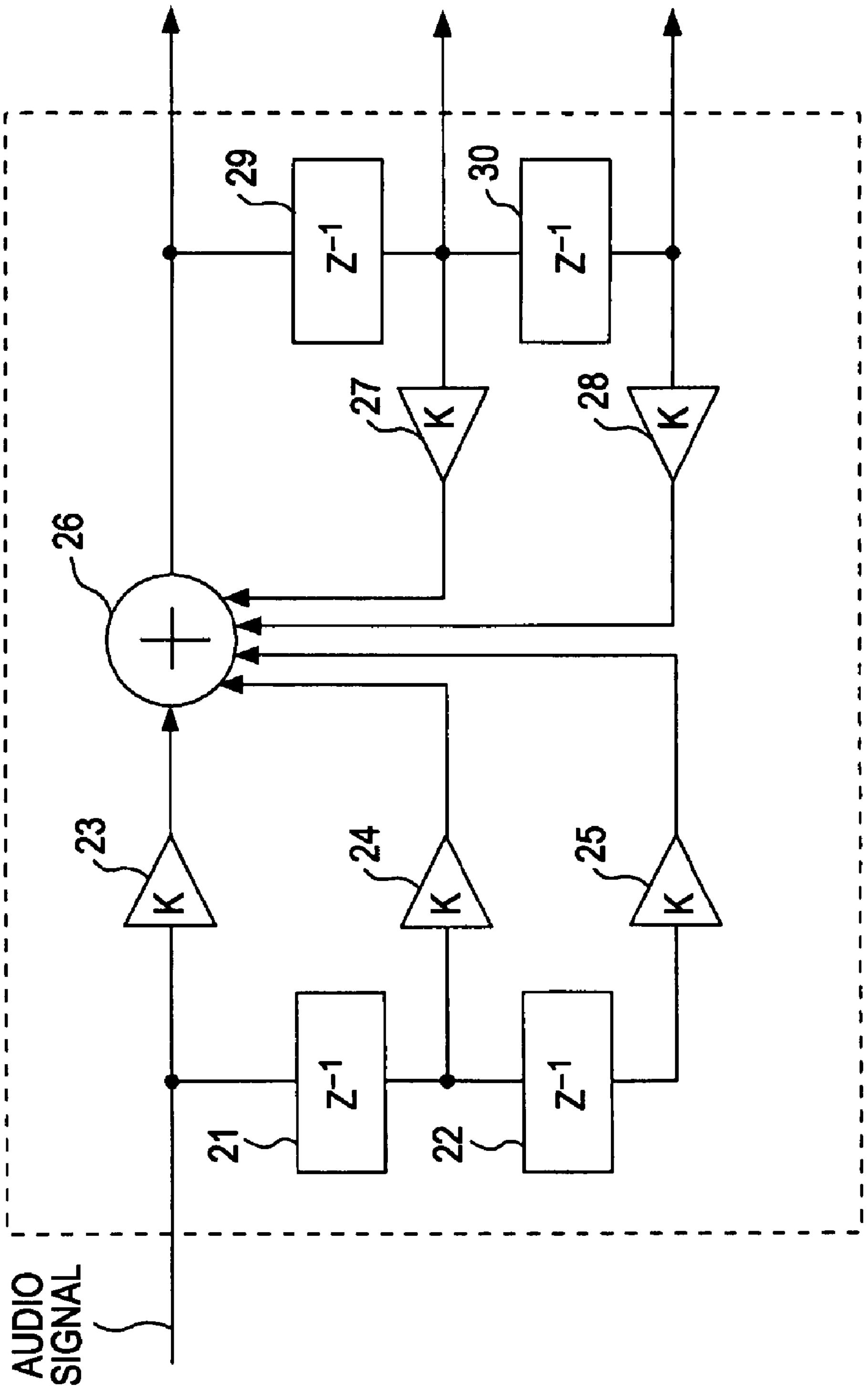
FIG. 3 is a block diagram showing an example of the configuration of an equalizer element provided in the signal processing apparatus according to the embodiment of the present invention.

FIG. 3 shows, as function blocks, components of an equalizer element using such an MPF.

As shown in FIG. 3, examples of the components of the MPF include delay elements 21, 22, 29, and 30, multipliers 23, 24, 25, 27, and 28, and an adder 26.

As shown in FIG. 3, the audio signal is input to the adder 26 via the multiplier 23 and is also input to the adder 26 via the delay element 21 and the multiplier 24. Furthermore, the audio signal via the delay element 21 is input to the adder 26 also via the delay element 22→the multiplier 25.

The addition output of the adder 26 is output to the outside as shown in the figure and is also made to branch and input to the adder 26 via the delay element 29→the multiplier 27.

A description will be given for the purpose of confirmation. The MPF shown in FIG. 3 is in charge of one equalizer element. For example, in the case of a 6-band equalizer, such MPFs are cascade-connected for 6 stages. In such a case, the delay element 29 and the delay element 30 are shared with the delay element 21 and the delay element 22 in the next MPF. That is, the outputs of the delay element 29 and the delay element 30 are input to the adder 26 of the above-described next MPF via the multiplier 24 and the multiplier 25 in the next MPF. Furthermore, the output of the adder 26 is also input to the adder 26 of the MPF next thereto.

In such an MPF, a multiplication coefficient can be set to various values with respect to each of the multipliers 23, 24, 25, 27, and 28. Setting of a center frequency, a gain value to be set at the center frequency, and a Q value can be performed according to the value of the coefficient that is supplied to each multiplier in the manner described above. That is, this makes it possible to realize functions as a so-called PEQ (Parametric Equalizer) capable of setting the center frequency, the gain value, and the Q value to various values.

In the DSP 4, a digital filter process of such an MPF is realized by performing numeric value calculations based on a program. The filter configuration as such an MPF is also known as a so-called biquad filter.

In this embodiment, correction of frequency-amplitude characteristics of audio output from the 4 speakers SP (SP-FR, SP-FL, SP-RR, and SP-RL) among the 6 speakers SP (SP-FC, SP-FR, SP-FL, SP-RR, SP-RL, and SP-SB) described earlier is performed. Accordingly, the above-described six equalizers are provided for each channel corresponding to 4 speakers SP.

In FIG. 1, the audio signal on which an audio signal process has been performed by the DSP 4 is converted into an analog signal by a D/A converter 5. Thereafter, the signal is amplified by an amplifier 6 and is supplied to an audio output terminal Tout.

In FIG. 1, a CPU (Central Processing Unit) 9 includes a ROM (Read Only Memory) 10 and a RAM (Random Access Memory) 11 and performs the total control of the relevant AV amplifier 1.

The CPU 9 performs communication via a bus 7 shown in the figure in order to control each section. As shown in the figure, a ROM 10, a RAM 11, a display controller 12, and the DSP 4 are connected to each other via the bus 7.

In the ROM 10 provided in the CPU 9, operation programs and various kinds of coefficients have been stored. In particular, in the case of this embodiment, in the ROM 10, a program (not shown) with which the CPU 9 performs a processing operation as an embodiment (to be described later) is also stored. The RAM 11 is used as a work area for the CPU 9.

Furthermore, an operation section 8 is connected to the CPU 9.

This operation section 8 includes various kinds of operation elements provided so as to be exposed in the exterior of the housing of the relevant AV amplifier 1, and a command signal in response to the operation of the operation section 8 is supplied to the CPU 9. The CPU 9 performs various kinds of control operation in response to a command signal from the operation section 8. As a result, in the AV amplifier 1, operation in response to an operation input of a user is performed.

Furthermore, the operation section 8 can also be provided with a command receiver for receiving a command signal in the form of an infrared-ray signal or the like transmitted from a remote commander. That is, the command receiver receives a command signal transmitted in response to an operation from the remote commander and supplies it to the CPU 9.

In this case, examples of an operation element to be provided in the operation section 8 include an operation element for performing parameter adjustment for each equalizer element using the DSP 4.

The user can instruct and input parameters (the center frequency, the gain value, and the Q value) to be set for each EQ element using the operation elements. The CPU 9 supplies a coefficient based on the input value to the DSP 4, so that a gain (gain window shape) corresponding to the instruction input value is set in a corresponding equalizer element.

Furthermore, the CPU 9 performs instructions for the display controller 12 so that the display content of a display section 13 is controlled. The display section 13 is formed by, for example, a display device such as an LCD (Liquid Crystal Display), and the display controller 12 controls the driving of the display section 13 on the basis of the instruction content from the CPU 9. As a result, on the display section 13, a screen display in response to the instructions from the CPU 9 is performed.

At this point, the AV amplifier 1 of the embodiment shown in FIG. 1 is provided with an automatic correction function for frequency-amplitude characteristics.

Initially, as a presumption, when performing correction of frequency-amplitude characteristics in this manner, a correction process is performed on frequency-amplitude characteristics of a particular channel among four channels corresponding to four speakers SP (SP-FR, SP-FL, SP-RR, and SP-RL). For the other remaining channels, the frequency-amplitude characteristics of the channel for which a correction process has been performed are set as target characteristics, and a correction process is performed.

Figure 4A:
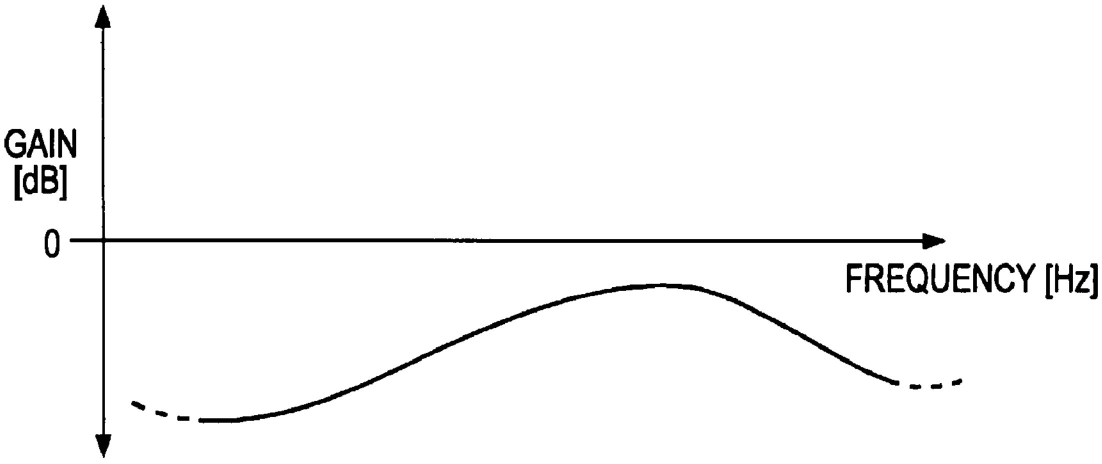
FIGS. 4A and 4B show an example of the relationship between measured frequency-amplitude characteristics and target characteristics.
Figure 4B:
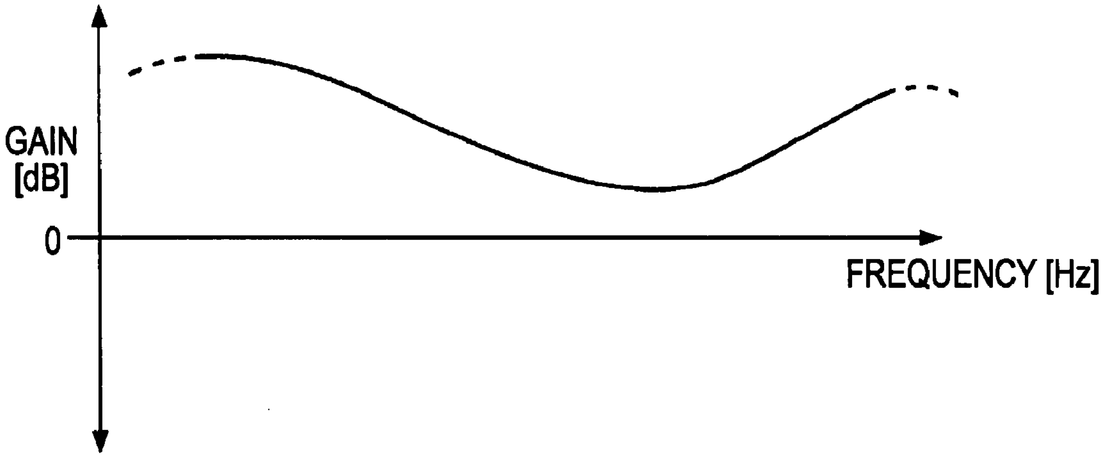

First, as the target characteristics of a first channel, characteristics that are flat over the entire frequency band are assumed to be set. For example, when frequency-amplitude characteristics shown in FIG. 4A are obtained, in a first correction process, ideally, the frequency-amplitude characteristics are made to be flat characteristics so as to cancel out the amplitude value of each band of FIG. 4A, as shown in FIG. 4B.

For the frequency-amplitude characteristics of the other remaining channels, by using the new frequency-amplitude characteristics obtained as a result of the first correction process as target characteristics, gain characteristics that cancel out the amplitude value of the frequency-amplitude characteristics between the channels are set.

When such correction of frequency-amplitude characteristics is performed, for the AV amplifier 1, there is a case in which a sufficient number of equalizer elements are not provided, for example, for the reasons of cost reduction. When, for example, the number of equalizer elements is comparatively small in this manner, there is a case in which a PEQ is used as each equalizer element as in this example. The reason for this is that, even when the number of elements is small, the in-charge range of one element is wide, the center frequency and Q (the degree of sharpness) can be changed using a PEQ, and therefore, characteristics can be corrected more flexibly.

However, regarding such a PEQ, since the number of parameters to be considered when obtaining target characteristics is greater than in the case of a GEQ (Graphic Equalizer), it is comparatively difficult to obtain desired characteristics. In particular, in a PEQ, since setting of a Q value is possible, the gain window shape of each element has a large expansion in the vicinity of the center frequency. This may cause gains that are set among elements to influence one another, and parameter setting in which these gains are taken into consideration becomes correspondingly difficult.

At this point, as was also described above, an automatic sound-field correction process for frequency-amplitude characteristics is performed prior to, for example, a normal audio reproduction operation from the fact that the automatic sound-field correction process is performed on the basis of a result in which a test signal is output. Therefore, if the time necessary for the automatic sound-field correction process is lengthened, the time a user has to wait is lengthened, resulting in a system with low ease of use.

When the above is considered, even in the case that a sound-field correction process is performed using a PEQ as in this embodiment, it is important to realize a useful system in which the processing time thereof is shortened as much as possible and as a result, the waiting time of the user is not lengthened.

For this reason, a sound-field correction process using a PEQ is requested to be as simplified as possible, and the processing time is requested to be shortened.

A correction operation as an embodiment to be described below is based on such points.

FIGS. 5A and 5B and FIGS. 6A and 6B illustrate a technique of a sound-field correction process for a first channel as this embodiment. In this embodiment, as such a first channel, the channel of a speaker SP-FL is set, and this will be referred to as Ach in the following description. In FIGS. 5A and 5B and FIGS. 6A and 6B, frequency-amplitude characteristics Tks when a gain (dB) is depicted in the vertical axis and a frequency (Hz) is depicted in the horizontal axis are shown.

At this point, prerequisites when performing a correction process of this embodiment will be described first.

In the case of this example, the number of elements of PEQs provided for each channel is assumed to be 6. In this case, these six equalizer elements (EQ elements) will be referred to as an EQ element-A, an EQ element-B, an EQ element-C, an EQ element-D, an EQ element-E, and an EQ element-F.

In this case, the range in which the gain can be adjusted is set to be a range of 10 octaves. In this range of 10 octaves, predetermined frequency points are set (each ○ mark in the figures). The intervals between these frequency points are equally divided at a ⅓ octave width. That is, in this case, a total of 31 frequency points are provided in the range in which the gain can be adjusted using an EQ element. However, for convenience of illustration of figures, since the frequency resolution at lower frequencies in the figures is decreased, only 30 frequency points are depicted.

In this case, each frequency point is also set as a point at which each EQ element can set a center frequency. That is, in each EQ element, the frequency of one of the frequency points of a ⅓ octave division can be selected and set as the center frequency.

For the convenience of description, the frequency point to be set in this case is assumed to be set so as to match a sampling point for frequency-amplitude characteristics in the DSP 4. That is, in the DSP 4 in this case, a gain value (amplitude value) for each frequency point in the figures is assumed to be held as the data of the frequency-amplitude characteristics Tsk.

In FIGS. 5A and 5B and FIGS. 6A and 6B, each of the characteristics Tsk is shown using an analog waveform, which is not the data actually held by the DSP 4.

In this case, in each EQ element, the upper limit of the gain value that can be set is assumed to be set at ±9 dB.

Based on the above assumption, a correction process as an embodiment will be described.

Initially, when a process for correcting frequency-amplitude characteristics is to be performed, as described above with reference to FIG. 1, an operation of measuring frequency-amplitude characteristics using the DSP 4 is performed. In this embodiment, since frequency-amplitude characteristics of audio output from the 4 speakers SP (SP-FR, SP-FL, SP-RR, and SP-RL) are made to be objects for correction, an operation of measuring frequency-amplitude characteristics is performed on all the channels of the speakers SP.

Conceptually, it may be understood that the correction process is performed on the basis of the result in which thus measured characteristics are compared with target characteristics. However, in practice, for the measured data itself, a small degree of unevenness appears due to the measurement environment, and the measured data, if it remains as it is, may be difficult to handle. Therefore, when correcting frequency-amplitude characteristics, measured data that has been subjected to a smoothing process is made to be an object for correction.

Also, in the embodiment, characteristics for the object of correction (hereinafter also referred to simply as "object characteristics") are those in which a smoothing process has been performed on measured data.

Figure 5A:
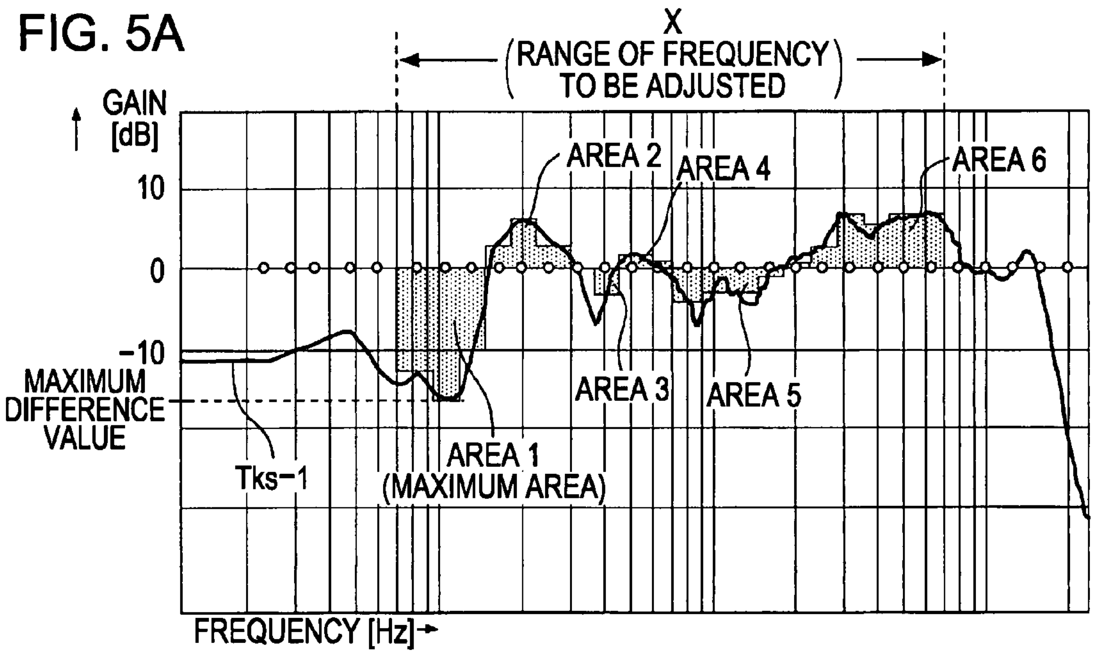
FIGS. 5A and 5B illustrate a correction processing operation for a certain channel according to the embodiment of the present invention.

The frequency-amplitude characteristics Tks-1 shown in FIG. 5A show characteristics such that a smoothing process has been performed on measurement characteristics in the manner described above.

The above description does not describe that, in the correction process as an embodiment, characteristics after a smoothing process need to be used as object characteristics, and in some cases, measured data itself can also be used as object characteristics. That is, object characteristics should preferably be based on the measurement result of the frequency-amplitude characteristics.

After the object characteristics of the frequency-amplitude characteristics are obtained in this manner, in the correction process in this case, as the setting of a range X of frequencies to be adjusted shown in FIG. 5A, the range of frequencies, in which gain adjustment for correction is performed, is narrowed down.

It is known that, as characteristics of general speakers, sound of a frequency band of extremely low and high frequencies cannot be output. In such a case, even if gain adjustment is performed for those frequency bands, there is no meaning in performing a correction process as long as it is difficult to finally output the sound from the speaker SP. As was also described above, when it is considered that the sound-field correction process is requested to be completed as short a time as possible, the following is undesirable that a wasted correction process is performed for those frequency bands and the necessary time until the processing is completed is lengthened.

By considering the above, in this embodiment, a correction process is performed after the object frequency range in which gain adjustment is performed is narrowed to the range X of frequencies to be adjusted. For example, in this embodiment, the range in which adjustment should be performed is assumed to be set in advance in view of the relationship with speaker characteristics described above. For example, as shown in the figures, it is assumed in this case that the frequency range in which the range of 5 frequency points at lowest frequencies and the range of 5 frequency points at highest frequencies are excluded is set in advance as the range X of frequencies to be adjusted.

The range X of frequencies to be adjusted, in addition to being set as a preset range in this manner, can also be set on the basis of, for example, frequency-amplitude characteristics that are actually measured.

When the range X of frequencies to be adjusted has been narrowed down in this manner, as indicated as areas 1 to 6 in FIG. 5A, in this case, the amount of the gain difference with the target characteristics is computed for each area divided by a portion where the gain (amplitude) of the object characteristics Tks-1 is insufficient from the target characteristics that are represented by a line of 0 dB and by a portion where the gain (amplitude) of the object characteristics Tks-1 is in excess of the target characteristics.

In the following, a portion where the gain is insufficient from the target characteristics will also be referred to as an insufficient-gain portion. A portion where the gain is in excess of the target characteristics will also be referred to as an excess-gain portion.

In this case, the amount of gain difference for each area divided by the insufficient-gain portion and the excess-gain portion is determined on the basis of the area size of the difference portion between the object characteristics Tks-1 and the target characteristics, as shown in the figure. More specifically, the gain difference (amplitude difference) between the target characteristics at each of the frequency points contained in each of the areas (1 to 6) and the object characteristics Tks-1 is determined.

In this case, the intervals between the adjacent frequency points are set to be a fixed width. Therefore, a fixed value as a value of the width between the adjacent frequency points is multiplied to the value of the gain difference determined for each of the frequency points, and those added together are computed as an area size for each area indicated by colored portions in the figure.

Here, a value of the frequency width using a fixed value is simply multiplied to the gain difference between the object characteristics Tks-1 and the target characteristics at each frequency point in order to determine an area portion in the shape of a bar graph, and the area size of each area is determined by adding them together. For example, when the area size of each area is to be determined with higher accuracy, an interpolation process in which the value of the gain difference at an adjacent frequency point is taken into consideration is performed, so that an area size can also be determined on the basis of a shape closer to a shape of the actual difference portion between the target characteristics and the object characteristics.

Alternatively, in particular, when the intervals between the adjacent frequency points are fixed as in this example, the amount of gain difference of each area can also be determined simply by adding together the gain difference at each frequency point for each area even if the area size is not determined forcibly.

When the area of the difference with the target characteristics is computed for each area divided by the insufficient-gain portion/the excess-gain portion, then, an area at a maximum among the areas is specified. FIG. 5A shows an example of a case in which an area 1 has a maximum size.

A description will be given for the sake of confirmation. An area having the largest difference area (the amount of gain difference) from target characteristics in the manner described above is an area for which correction is necessary most.

When the area having the maximum difference area is specified, the frequency point at which the gain difference from the target characteristics becomes at a maximum in that area is selected.

That is, in this case, in the area 1 having the maximum size, as the frequency point at which the gain difference from the target characteristics becomes at a maximum, the frequency point having the gain difference indicated as the "maximum difference value" in the figure is selected.

When the frequency point at which the gain difference from the target characteristics in the area having the maximum difference area is selected, in this case, the value of the center frequency of one EQ element selected from among 6 provided EQ elements (EQ elements A to F) is determined on the basis of the frequency of the selected frequency point having the maximum gain difference.

In this case, as described earlier, in each EQ element, the center frequency is selected and set from among the frequency points that are set in advance. That is, in this case, the frequency point at which the gain difference becomes at a maximum typically matches the frequency point at which each EQ element can set the center frequency. Therefore, the frequency of the specified frequency point having the maximum gain difference is determined as it is as the center frequency of the selected EQ element.

At this point, the center frequency of the EQ element A is assumed to be determined as the frequency of the selected frequency point having the maximum gain difference.

Furthermore, the gain value of the center frequency of the selected EQ element is determined to be a value based on the gain difference between the object characteristics Tks-1 and the target characteristics at the selected frequency point.

More specifically, in order to cancel out the gain difference from the target characteristics, in principle, the inverted value of the value of the gain difference at the selected frequency point having the maximum gain difference is determined as the gain value of the center frequency of the selected EQ element.

For example, in this case, if the gain value of the object characteristics Tks-1 indicated as the "maximum difference value" is −15 dB and the gain difference from the target characteristics is that −15 dB-0 dB=−15, in principle, "+15", which is an inverted value of the value "−15" of the gain difference, is determined as the gain value of the selected E element-A.

However, the range in which the gain value can be set in this case is ±9 dB as was also described above. When the gain value to be determined in this manner exceeds the range of the gain values that can be actually set to the EQ element, the maximum gain value is determined within the settable range. More specifically, as indicated as a gain G-dis in FIG. 5B, as the gain value based on the maximum difference value in this case, for example, +9 dB is determined.

A description will be given for the purpose of confirmation. Even the case in which the maximum gain value is to be determined in this manner within the settable range is the same as that in which the gain value is determined to be a value based on the gain difference between the object characteristics Tks-1 and the target characteristics. If the gain value of the selected EQ element is determined to be a value based on the gain difference with the target characteristics, the gain value can be determined in such a manner as to cancel out the gain difference with the target characteristics.

In the manner described above, first, the center frequency and the gain value of the first EQ element selected from among a plurality of EQ elements are determined.

After that, in this case, the Q value is determined for the EQ element serving as a PEQ.

Figure 5B:
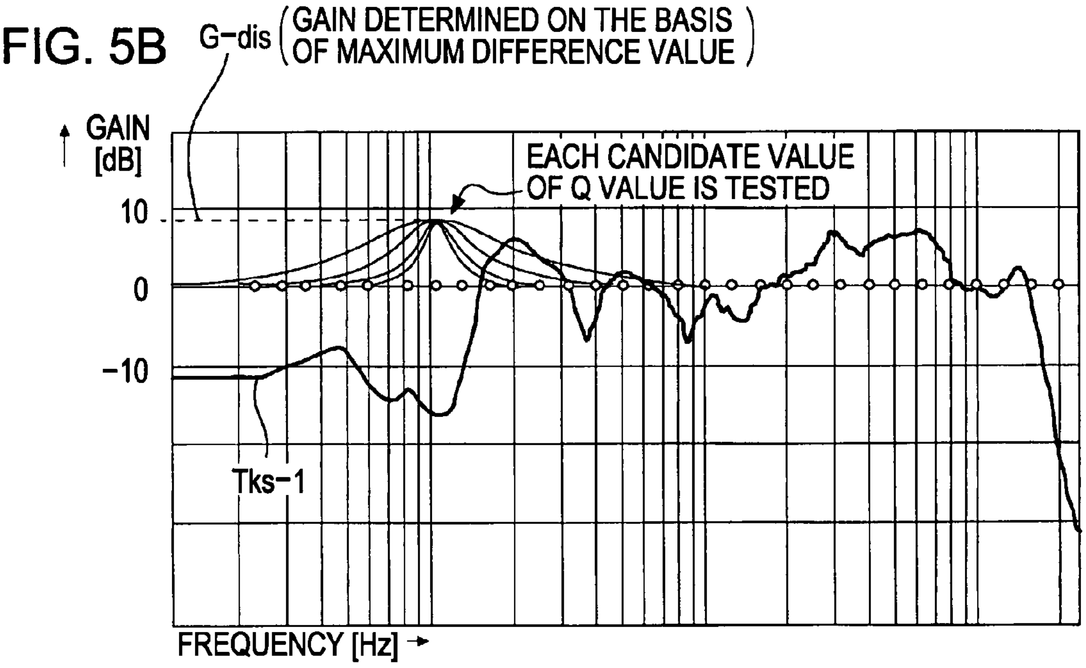

For that purpose, first, as shown in FIG. 5B, each candidate value of the Q value is tested. That is, frequency-amplitude characteristics obtained when the determined center frequency and the determined gain value are set and each predetermined candidate value of Q is set are computed, and thereby the Q value at which characteristics closest to the target characteristics is obtained is determined.

Figure 6A:
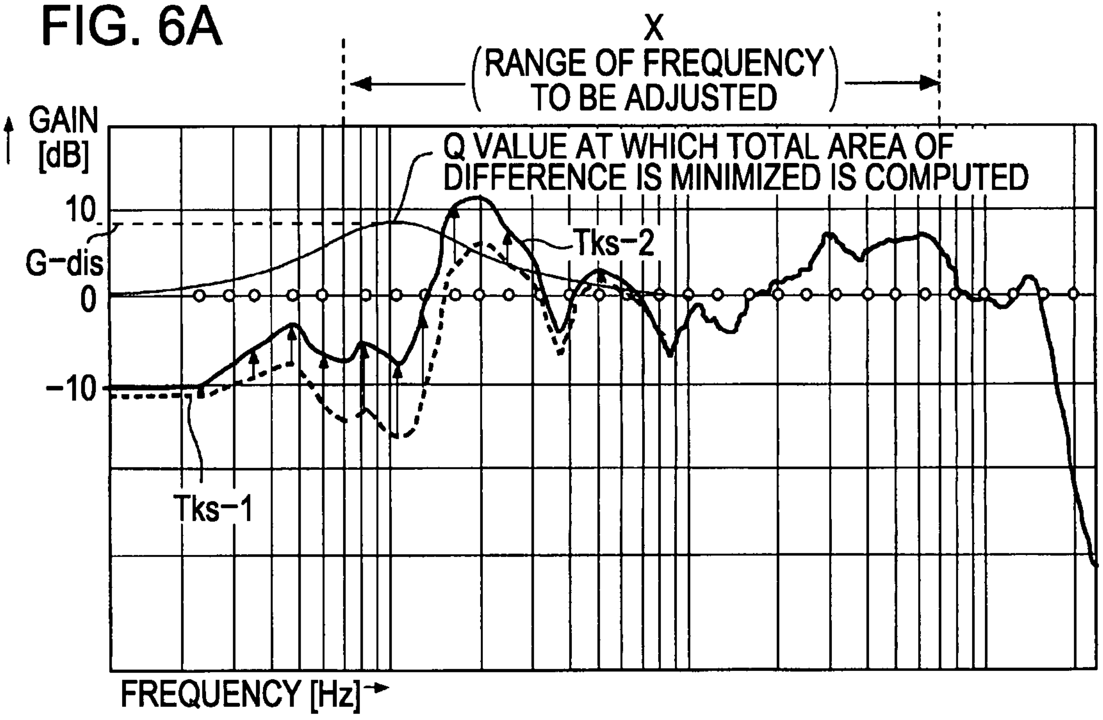
FIGS. 6A and 6B illustrate a correction processing operation for a certain channel in a similar manner according to the embodiment of the present invention.

More specifically, as shown in FIG. 6A, for the Q value at which characteristics closest to the target characteristics are obtained, the Q value at which the total area of the difference between the computed characteristics and the target characteristics is at a minimum is computed.

That is, in this case, with respect to the selected EQ element-A, the center frequency is set as the frequency of the selected frequency point and the gain value is set to +9 dB, and then frequency-amplitude characteristics when each candidate value for a preset Q value is set are computed. At this time, characteristics are computed by assuming that the gain value is set to 0 dB for the other EQ elements other than the selected EQ element.

Then, regarding the computed characteristics, the total area of the difference with the target characteristics are computed, and a candidate value of Q at which the computed total area value becomes at a minimum is computed.

A description will be given for the purpose of confirmation. Also, in this case, the area of the difference with the target characteristics may be computed on the basis of the result in which the gain difference between the computed characteristics and the target characteristics is determined at each frequency point. Also, in this case, the area may not be used, and the sum of the gain differences at each frequency point can also be simply handled as the value of the total area.

When a candidate value for Q at which the total area of the difference with the target characteristics is at a minimum and characteristics closest to the target characteristics can be obtained is computed in this manner, the candidate value is determined as the value of Q of the selected EQ element.

In FIG. 6A, the gain window shape obtained by the selected EQ element (EQ element-A) and frequency-amplitude characteristics Tks-2 (characteristics indicated using a broken line in the figure: also referred to as computed characteristics) when this Q value is set when the Q value at which the difference total area is at a minimum in this manner are shown. Furthermore, in FIG. 6A, object characteristics Tks-1 are shown using a solid line for the purpose of comparison with the computed characteristics Tks-2.

As a result of the operation thus far, parameters (the values of the center frequency, the gain value, and the Q value) to be set to the first EQ element for the purpose of correction in response to the area having the maximum size (the amount of gain difference) of the difference between the object characteristics Tks-1 and the target characteristics are determined.

Next, when each value for correction with regard to the first EQ element is determined, with regard to frequency-amplitude characteristics (that is, the above-described computed characteristics Tks-2 in this case) obtained when each value determined for the EQ element is set, processes for specifying an area having the maximum amount of gain difference with the target characteristics and for determining the center frequency to be set to the next EQ element on the basis of the frequency point at which the gain difference becomes at a maximum within the area are performed.

At this time, it is presupposed in this example that no further change of the values is performed with regard to the EQ element (the EQ element-A at this point in time) for which each value has already been determined. That is, by assuming that those determined values have been set with regard to the EQ element for which each value has already been determined, new characteristics are computed.

In this case, also, the computation of the amount of gain difference is performed by targeting only the set range X of frequencies to be adjusted.

Figure 6B:
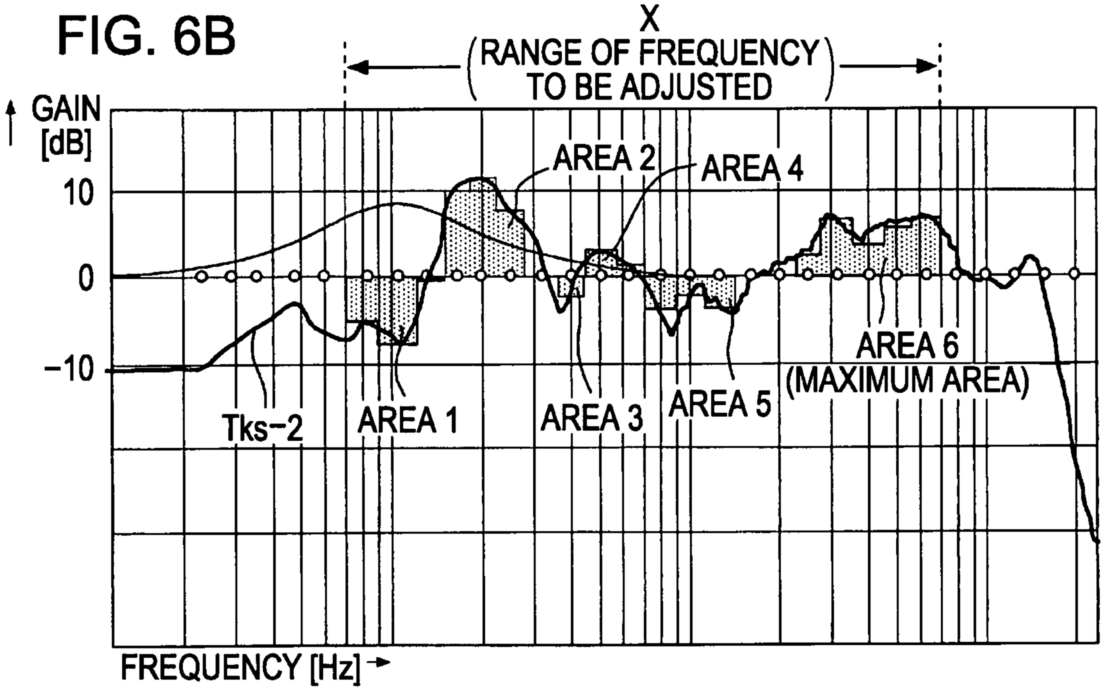

In this case, FIG. 6B shows an example in which the area having the maximum difference area between the target characteristics and the computed characteristics Tks-2 (indicated using a solid line) is an area 6. The center frequency to be set to the next selected EQ element (EQ element B) is determined to be the frequency of the frequency point at which the gain difference with the target characteristics becomes at a maximum within the area 6.

When the center frequency of the next EQ element is determined in this manner, both the gain value and the value are determined in accordance with a procedure similar to the previous case.

That is, the gain value is determined to be a value based on the gain difference between the computed characteristics and the target characteristics at the selected frequency point at which the gain difference becomes at a maximum. More specifically, the gain value is determined to be an inverted value of the gain difference (the gain value of the computed characteristics—the gain value of the target characteristics) with the target characteristics.

Then, the Q value is determined to be a candidate value when characteristics closest to the target characteristics are obtained on the basis of the result in which the determined center frequency and the gain value are set, and the frequency-amplitude characteristics obtained when each Q candidate value is set are computed.

A description will be given for the purpose of confirmation. When frequency-amplitude characteristics are computed to determine the Q value in this case, by assuming that each of the determined values is set in the EQ element (the EQ element-A in this case) for which each value has already been determined, the overall characteristics are computed.

Also, hereinafter, with regard to the remaining EQ elements, in a similar manner, processes for specifying a maximum area and for determining each value for the selected EQ element are sequentially performed on the basis of the frequency point at which the gain difference becomes at a maximum within the maximum area and the gain difference are sequentially performed.

That is, after an element is selected and each value is determined with regard to the first EQ element (the EQ element-A in this case), the following processing is repeatedly performed for the second and subsequent EQ elements:

with regard to the frequency-amplitude characteristics (computed characteristics) obtained when the determined center frequency, the gain value, and the Q value are set in the EQ element for which each value has already been determined, after the difference area with the target characteristics is computed to specify an area at which the difference area becomes at a maximum, the frequency point at which the gain difference from the target characteristics in that area becomes at a maximum is selected, the center frequency of the selected EQ element is determined on the basis of the frequency of the selected frequency point at which the gain difference is at a maximum, the gain value to be set to the determined center frequency is determined to be a value based on the gain difference between the computed characteristics and the target characteristics at the selected frequency point, and the Q value of the selected EQ element is determined to be a candidate value when characteristics closest to the target characteristics are obtained on the basis of the result in which the center frequency and the gain value, which are determined in the manner described above, are set in the EQ element, and frequency-amplitude characteristics obtained when each of the predetermined candidate values is set are computed (also in this case, by assuming that each of the determined values is set in the EQ element for which each value has already been determined, the overall characteristics are computed).

When each value is determined with regard to all EQ elements by the above-described repeated processing, those determined values are set as parameters of the corresponding EQ element.

That is, a coefficient for indicating each of the determined values for each EQ element is supplied to the DSP 4, and in response, the DSP 4 sets each of the supplied coefficients as a coefficient for the multiplier (see FIG. 3) of each EQ element.

In the technique of the correction process adopted in this embodiment in the manner described above, a gain is adjusted so that the characteristics approach target characteristics while each candidate value of Q is tested in sequence for each EQ element starting from the portion where the difference with the target characteristics is large. According to this, when the influence of the gain exerts on one another among the elements on the basis of the set value of Q, it is possible to perform correction so as to cause the characteristics to appropriately approach the target characteristics.

That is, also, as a result, when a PEQ is used as an effector for correcting frequency-amplitude characteristics, the parameter for each element can be adjusted so as to appropriately match the target characteristics.

As a result of performing correction in sequence starting from the portion in which the difference with the target characteristics is large in the manner described above, the correction in this case is performed by gradually targeting from a macroscopic portion to a micro portion. More specifically, the Q value is determined (set) with a higher priority by the first EQ element, and a portion for which correction is necessary most is adjusted with a higher priority. Thereafter, the Q value of the portion for which correction is necessary next is sequentially determined with a higher priority in a similar manner in order to perform correction.

As a result of adopting such a technique, also when the number of EQ elements is small, it is possible to efficiently perform correction so as to match the target characteristics by placing importance on the correction efficiency by each element.

The technique of the correction process adopted in this embodiment can be realized by a repetition of comparatively simple computations, such as at least the computation of a difference area for specifying an area in which the amount of gain difference is at a maximum, the computation of a gain value to be set in a selected EQ element, the computation of each of frequency-amplitude characteristics when each Q candidate value is set, and the computation of the total difference area between each of the computed frequency-amplitude characteristics and the target characteristics. Therefore, the processing time takes a comparatively short time. That is, according to this, also when a PEQ is used as an effector for performing correction of frequency-amplitude characteristics, the time of the correction process for obtaining target characteristics can be in a comparatively short time, and the time for the user has to wait can be shortened, thereby realizing a useful system.

Up to this point, there has been described a process for causing the object characteristics Tks-1 to match predetermined target characteristics (for example, flat characteristics) with regard to a particular channel (Ach: the channel of the speaker SP-FL in this case). Next, a correction process for the remaining three channels is performed by using the corrected characteristics computed by a correction process for Ach as target characteristics.

A description will be given, with reference to FIGS. 7 and 8, of a correction processing operation for such remaining channels.

FIG. 7 shows characteristics after correction of frequency-amplitude characteristics (frequency-amplitude characteristics of Ach) of audio output from the speaker SP-FL, and frequency-amplitude characteristics of one channel from among the remaining three channels.

As was also described above, when the difference in the frequency-amplitude characteristics of audio output from the right and left speakers SP is large, distortion of a sound image occurs.

Up to this point, only the distortion of a sound image resulting from the difference in the right and left characteristics has been considered as a problem. In the case of 5.1-ch as in this embodiment, if the difference in the frequency-amplitude characteristics of audio output from a pair of front and rear speakers SP is large, a sense of realism to be provided to the user is deteriorated.

Therefore, in order to solve these problems, by using the corrected characteristics of Ach as the target characteristics, a correction process for bringing the frequency-amplitude characteristics of the remaining three channels thereto is performed.

In the following, a correction process of a particular channel among the channels (referred to collectively as Bch) other than Ach will be described as an example. The same processing may be performed on the remaining channels.

Initially, when frequency-amplitude characteristics of Bch are to be corrected by using the corrected characteristics of Ach as target characteristics in the manner described above, with regard to frequency-amplitude characteristics measured for a certain channel for the object of processing within Bch, in addition to the range X of frequencies to be adjusted described earlier, a low frequency band within the range X of frequencies to be adjusted is set as "inter-channel difference priority band".

As has thus been described, when the difference in the frequency-amplitude characteristics of audio output from the right and left speakers SP is large, distortion of a sound image occurs. In particular, when the difference in the frequency-amplitude characteristics at the low frequency band is large, the distortion of a sound image is conspicuous. Therefore, an inter-channel difference priority band for evaluating the difference in the frequency-amplitude characteristics of audio output from the two speakers SP of Ach and Bch is set at lower frequencies.

Figure 7A:
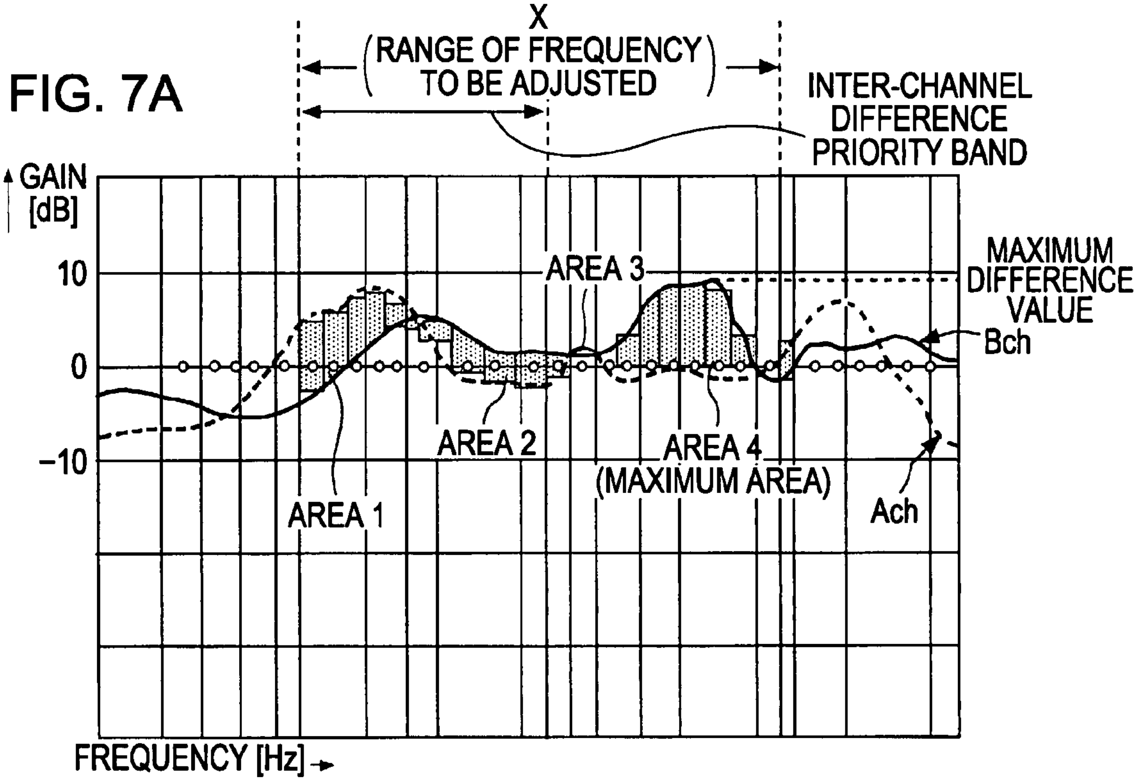
FIGS. 7A and 7B illustrate a correction processing operation for another channel according to the embodiment of the present invention.

Considering the above-described content, a description will be given of a process for decreasing the difference area between Ach and Bch with reference to FIG. 7A.

First, in the adjustment in this case, the aim is that the difference in both the frequency-amplitude characteristics of Ach and Bch is decreased. For this purpose, in the first procedure, as indicated as areas 1 to 4, the amount of the gain difference with the target characteristics is computed for each area divided by a portion in which a gain (amplitude) of Bch, which shows object characteristics, is insufficient from Ach, which show target characteristics and by a portion in which the gain is in excess.

That is, in the previous correction process for the object characteristics Tks-1, since the target characteristics are flat characteristics of a gain 0, a portion in which the gain is in excess of the straight line of the gain 0 was referred to as an excess-gain portion, and a portion in which the gain is insufficient was referred to as an insufficient-gain portion. In the correction computation process for this time, the target characteristics are characteristics of Ach and are not in the form of a straight line. Therefore, the area is divided for each intersection point of both the frequency-amplitude characteristics of Ach and Bch.

The method of computing the area surrounded by both the characteristics of Ach and Bch is the same as that shown in FIGS. 5A and 5B. That is, the area portion in the shape of a bar graph is determined by multiplying the value of a frequency width using a fixed value to the gain difference between the object characteristics (characteristics of Bch) and the target characteristics (characteristics of Ach) at the frequency point that is set, for example, at fixed intervals, and these are added together, thereby determining the size of each area.

Then, the size of each area is computed, and the aim is that the size of each area is decreased, that is, the difference in the frequency-amplitude characteristics of Ach and Bch is decreased. FIG. 7A shows that the area 4 has a maximum size.

Regarding the above-described correction process for Ach, since it is sometimes difficult to assign a sufficient number of elements when correction of frequency-amplitude characteristics is to be performed, the proper method is that a correction computation process is simply performed sequentially starting from an area having the maximum difference size. That is, in order to decrease the difference in the frequency-amplitude characteristics so as to allow them to match each other, by considering that the area having the maximum size as an "area for which correction is necessary most", correction is performed in the order in which the area size is large. As was also described above, it has been revealed that what greatly affects the distortion of a sound image is the difference in the frequency-amplitude characteristics at the low frequency band. In order to correct such a difference in the frequency-amplitude characteristics at the low frequency band, even if the size of the area at the inter-channel difference priority band is smaller than the size of the area at other than the inter-channel difference priority band, it can be considered that a correction computation process needs to be performed starting from the inter-channel difference priority band with a higher priority. Therefore, when correction of frequency-amplitude characteristics of Bch is to be performed, a process of "setting a weight" for increasing the computation area is performed regarding the area within the inter-channel difference priority band.

Accordingly, next, weighting will be described.

A specific application of weighting will be described with reference to FIG. 7B.

It can be seen from the example in this case that the area 1 and the area 2 are positioned within the inter-channel difference priority band. As can be seen from FIG. 7B, the area 4 has the maximum size within the range X of frequencies to be adjusted. Therefore, as described with reference to FIG. 7A, the area for which the correction computation process is performed first is the area 4. On the other hand, when a weight is set in the process shown in FIG. 7B, correction can be performed starting from the area within the inter-channel difference priority band other than the area 4 with a higher priority.

Figure 7B:
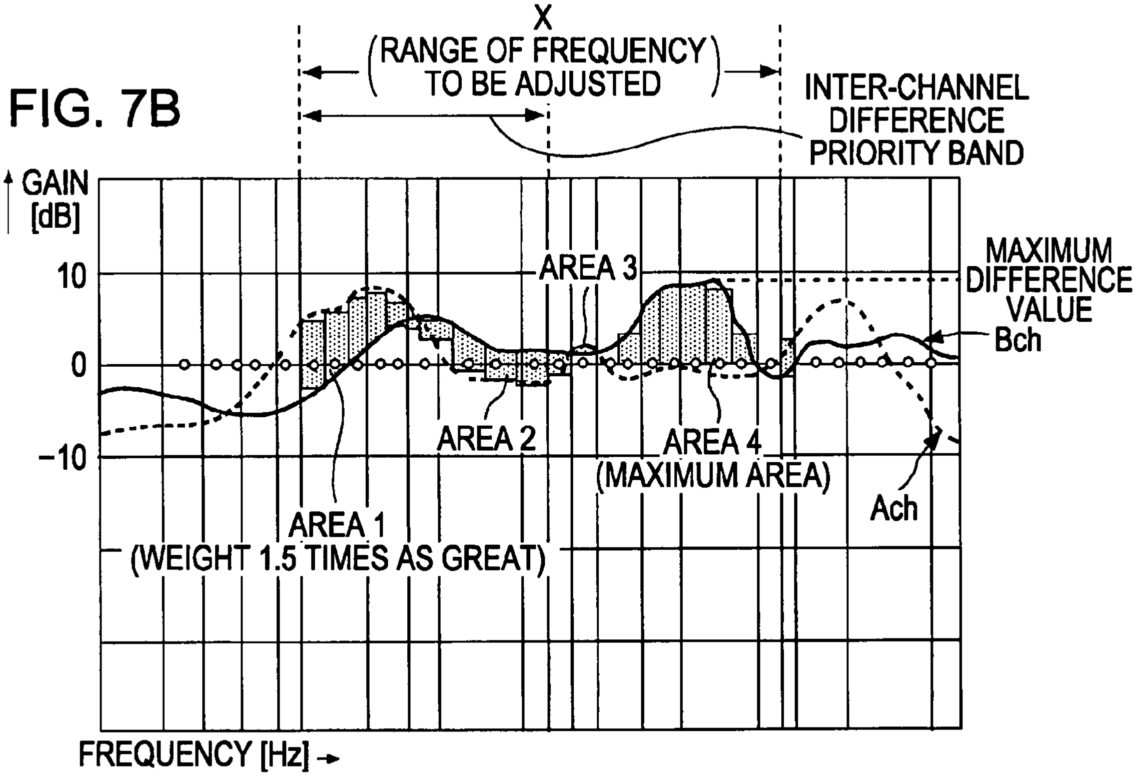

In FIG. 7B, when the size of the area 1 positioned within the inter-channel difference priority band is compared with the size of the area 4 at other than the inter-channel difference priority band, in the case that a weight has not been set, the area 4 has a larger size. It is assumed that, for example, the size of the area 4 is 10 and the size of the area 1 before a weight is set is 8.

At this point, as a result of setting a weight in the area 1, if the size of the area 1 is greater than the size of the area 4, the area 1 is corrected with a higher priority. For example, when the coefficient at the time of setting a weight is 1.5 as shown in FIG. 7B as an example, the area size (hereinafter referred to as an "evaluation area") as a result of setting a weight to the area 1 is 12. For this reason, the area 1 (evaluation area=12) is larger than the area 4 (area=10), and as a result, correction is performed starting from the area 1 with a higher priority. Therefore, a correction computation process is performed with a higher priority starting from the area positioned at the inter-channel difference priority band, and it is possible to decrease the difference in the frequency-amplitude characteristics of the two channels in that area.

Here, only the correction process of the frequency-amplitude characteristics of Ach and Bch among the four channels has been described. The same processing will be performed regarding the correction process of frequency-amplitude characteristics of the remaining two channels as Bch.

Next, a description will be given, with reference to part (a) of FIG. 8, of a method of evaluating a weight within the range X of frequencies to be adjusted, in particular, at the inter-channel difference priority band.

In this embodiment, the point to be noted is that, in the first correction computation process, correction is performed without setting the above-described weight. That is, when a correction computation process for Bch having object characteristics, is to be performed by using the corrected characteristics of Ach as target characteristics, first, correction is performed starting from an area having the maximum size in the entire range X of frequencies to be adjusted without giving a priority to the inter-channel difference priority band. It is then determined whether the distortion of the sound image has been reduced as a result of performing the correction computation process without a weight. When the distortion of the sound image has been reduced, the processing is completed in one correction computation process without setting a weight. If the characteristics can be corrected without a weight, correction is possible without sacrificing the other frequency bands.

Next, when the distortion of the sound image has not been reduced by the first correction computation process, a weight is set starting from the second correction computation process. Furthermore, as a result of setting a weight, the evaluation area will increase.

When the distortion of the sound image has not been reduced even by the second correction computation process, a weight of a larger coefficient is set in a third correction computation process. In consequence, the evaluation area will be increased more than at the second time. That is, since the distortion of the sound image has not been reduced even by the first and second correction computation processes, a larger coefficient is used at the third time in order to increase the evaluation area so that the area at the inter-channel difference priority band is more easily corrected than the area at the other frequency bands with a higher priority.

A coefficient of a weight will be described with reference to part (b) of FIG. 8.

Figure 8:
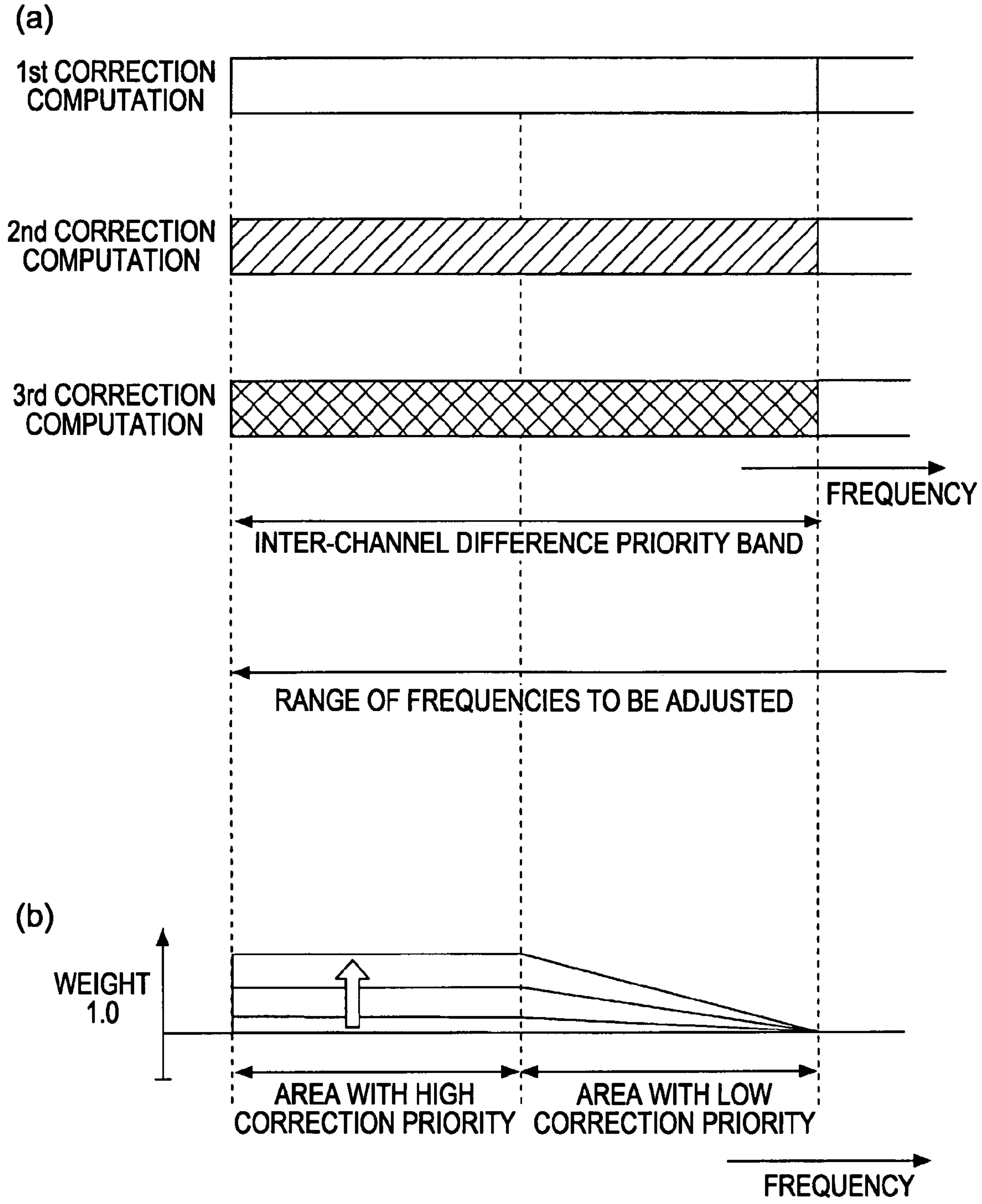
FIG. 8 illustrates weighting according to the embodiment of the present invention.

In part (b) of FIG. 8, the inter-channel difference priority band is divided into two areas of an area with a high priority in which the frequency is low and an area with a low priority in which the frequency is high.

In this embodiment, after such band splitting is performed, a weight coefficient is changed also at the inter-channel difference priority band. That is, since there is more influence on the distortion of the sound image at lower frequencies within the inter-channel difference priority band, the higher the area with a high correction priority, the larger the weight coefficient used. With regard to the area with a low correction priority at the inter-channel difference priority band, a weight is set, which is lower than that in the area with a high correction priority. That is, with regard to an area positioned in the area with a low correction priority, a weight coefficient smaller than that in the area with a high correction priority is set.

In the area with a high correction priority, since a weight is not set for the first correction computation process, the weight coefficient is "1.0". As the number of correction computation processes is increased, the weight coefficient is increased by a predetermined level.

Since a weight is not set also in the area with a low correction priority when performing the first correction computation process, the weight coefficient is "1.0". The fact that the weight coefficient increases with an increase in the number of times of correction computation processes is the same as for the area with a high correction priority. In addition, in the area with a low correction priority, the straight line indicating a weight is inclined so that, as the priority decreases, that is, as the frequency increases, the weight coefficient decreases.

In the areas other than those described above, a weight is not set. For this reason, in the areas other than the area with a high priority and the area with a low priority, that is, at other than the inter-channel difference priority band, the weight coefficient is typically kept at "1.0".

As a result of the above, in this embodiment, as the frequency increases in the order of the area with a high correction priority→the area with a low correction priority, the numeric value of the weight is decreased.

As described above, in the correction computation process according to this embodiment, regarding a certain channel among a plurality of channels, a correction process is performed by using flat characteristics as target characteristics, and regarding the other remaining channels, a correction process is performed by using characteristics after correction obtained by performing a correction process for the first time as target characteristics. According to the above-described operation, since the frequency-amplitude characteristics of another channel are brought close to the frequency-amplitude characteristics of a certain channel, it is possible to decrease the difference in the frequency-amplitude characteristics for each channel. That is, since the difference in the frequency-amplitude characteristics of audio output from a pair of right and left speakers SP is decreased, the distortion of the sound image to be output can also be reduced. Furthermore, since the difference in the frequency-amplitude characteristics of audio output from a pair of front and rear speakers SP is also decreased, as a result, it is possible to provide a higher sense of realism to a listener.

Furthermore, in this embodiment, an inter-channel difference priority band is provided at lower frequencies within the range X of frequencies to be adjusted, and a weight is set to the difference area formed by the difference in the characteristics positioned in the range. As a result of setting a weight in the manner described above, even when a correction process is to be performed using a lesser number of elements using a PEQ, it is possible to efficiently perform a correction process for decreasing the difference area of the low frequency band.

Next, a description will be given below, with reference to the flowchart in FIG. 9, a processing operation to be performed to realize a sound-field correction process for a first channel (Ach) as this embodiment based on the above description.

Figure 9:
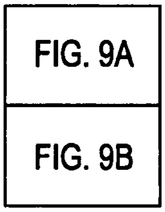
FIG. 9 is a flowchart showing a correction processing operation for a certain channel according to the embodiment of the present invention.
Figure 9A:
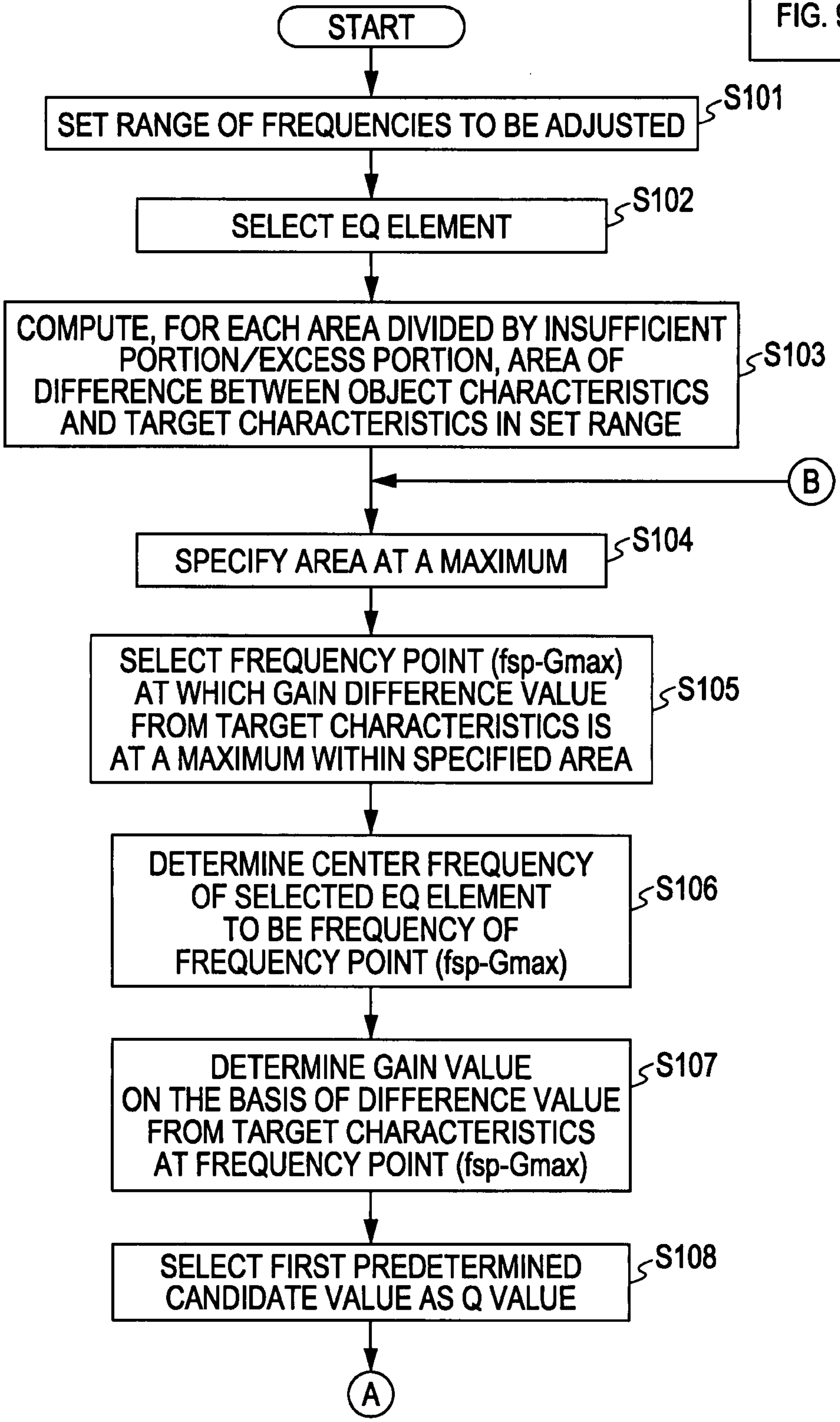
Figure 9B:
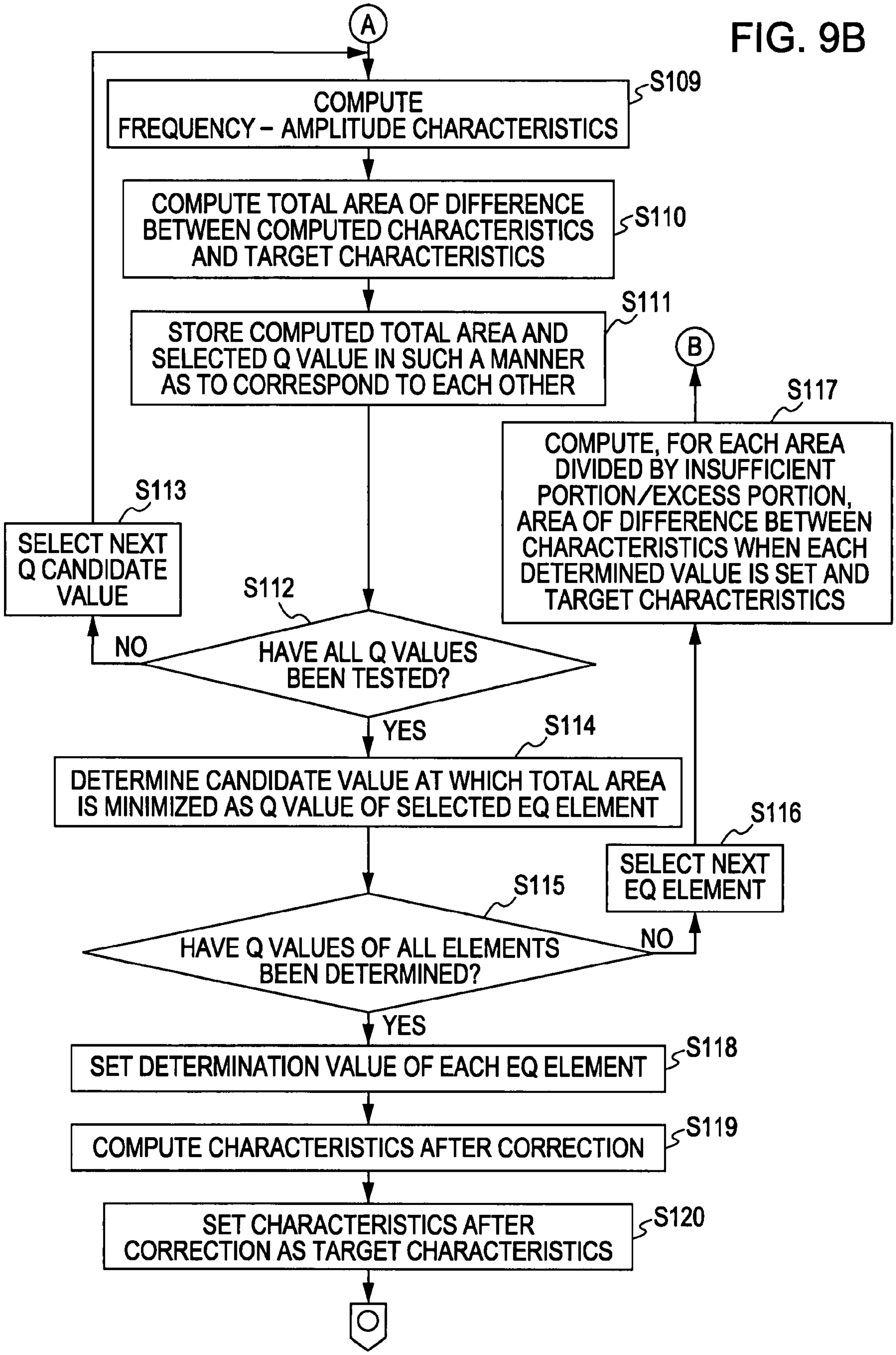

The processing operation shown in FIG. 9 is performed by a CPU 9 shown in FIG. 1 in accordance with a program stored in the ROM 10.

When the processing operation of FIGS. 11 and 12 (to be described later), including FIG. 9, is to be performed, it is assumed that frequency-amplitude characteristics of four channels have already been measured by the DSP 4 in accordance with the instructions of the CPU 9, and the information on the frequency-amplitude characteristics for the four channels, which was obtained on the basis of the result, has already been supplied to the CPU 9 and stored therein.

In FIG. 9, at first, in step S101, the range X of frequencies to be adjusted is set. That is, as described above with reference to FIGS. 5A and 5B, in this case, a predetermined range X of frequencies to be adjusted is set.

In the subsequent step S102, an EQ element is selected. That is, in this case, a first EQ element (for example, an EQ element A) is selected from among the six elements of the EQ elements A to F.

Then, in step S103, a process is performed for computing, for each area divided by the insufficient-gain portion/the excess-gain portion, the area of the difference between the object characteristics and the target characteristics in the set range. That is, in the predetermined range X of frequencies to be adjusted, an area of the difference with target characteristics is computed for each area divided by a portion in which the gain (amplitude) is insufficient from target characteristics indicated by a line of 0 dB in this case, and a portion in which the gain is in excess, with regard to object characteristics based on the measurement result by the DSP 4.

In step S104, an area having a maximum size is specified on the basis of the computation result in step S103.

In step S105, a frequency point (fsp-Gmax) at which the gain difference value from the target characteristics becomes at a maximum in the specified area is selected.

After that, in step S106, the center frequency of the selected EQ element is determined to be the frequency of the frequency point (fsp-Gmax).

In step S107, the gain value is determined on the basis of the difference value from the target characteristics at the frequency point (fsp-Gmax). That is, the inverted value of the difference value between the gain value of the object characteristics and the gain value of the target characteristics at the frequency point (fsp-Gmax) is determined as the gain value of the center frequency of the selected EQ element.

In the subsequent step S108, a first predetermined candidate value is selected as the Q value. That is, a predetermined candidate value is selected as a first candidate value from among candidate values of Q, which are set in advance.

In the next step S109, computation of frequency-amplitude characteristics is performed. That is, the center frequency and the gain value, which are determined in step S106 and step S107, respectively, are set in the EQ element selected in step S102. Also, as the Q value, frequency-amplitude characteristics obtained when the candidate value selected in step S108 above (or step S113 (to be described later)) is computed.

In the subsequent step S110, the total area of the difference between the computed characteristics and the target characteristics is computed. In the next step S111, the computed total area and the selected Q value are stored in, for example, the RAM 11 in such a manner as to correspond to each other.

In step S112, a process is performed for determining whether or not all the Q values have been tested. That is, with regard to all the preset Q candidate values, a process for computing frequency-amplitude characteristics when they are set, and a process for determining whether or not the total area has been computed are performed.

When a negative result is obtained in step S112 by regarding that all the Q values have not yet been tested, the process proceeds to step S113, where the next Q candidate value is selected and thereafter, the process returns to the process for computing frequency-amplitude characteristics in the previous step S109. That is, the processing undergoing step S112→step S113 forms a routine for testing all the Q candidate values.

On the other hand, when an affirmative result is obtained in step S112 by regarding that all the Q values have been tested, the process proceeds to step S114, where the candidate value at which the total area is at a minimum is determined to be the Q value of the selected EQ element.

In the subsequent step S115, a process is performed for determining whether or not the Q values of all the elements have been determined.

When a negative result is obtained by regarding that the Q values for all the EQ elements have not yet been determined, the process proceeds to step S116, where the next EQ element is selected. That is, one EQ element is selected from other than the EQ elements for which the center frequency, the gain value, and the Q value have already been determined.

In step S117, the area of the difference between the frequency-amplitude characteristics (the computed characteristics) when the determined values (the center frequency, the gain, and the Q) are set and the target characteristics is computed for each area divided by the insufficient-gain portion/the excess-gain portion.

In this case, the frequency-amplitude characteristics into which each determination value has already been reflected have been computed by the process of the previous step S109. In consequence, if the information thereof is stored, the difference area between the computed characteristics and the target characteristics may be computed for each area divided by the insufficient-gain portion/the excess-gain portion in the same manner as in the previous step S103.

When the computation process in step S110 computes a difference area for each area of the insufficient-gain portion/the excess-gain portion and adds the area value for each of the areas in order to determine the total area value in a similar manner, in step S117, there is no need to determine the area for each insufficient-gain portion/excess-gain portion once more, and the area value of each area can be obtained on the basis of the area information for each area, which has already been computed in the manner described above.

When the above-described process of step S117 is performed, the process returns to the previous step S104 as shown in the figure, where a process is performed for specifying an area having a maximum size. That is, as a result, until each value is determined with regard to all the EQ elements, processes are repeatedly performed for selecting an EQ element, determining the center frequency and the gain value of the selected EQ element, and determining the Q value after each Q candidate value is tested.

When an affirmative result is obtained in step S115 by regarding that the Q values of all the elements have been determined, the process proceeds to step S118, where a process is performed for setting a determination value of each EQ element. That is, as described above, a coefficient for indicating each value for each determined EQ element is supplied to the DSP 4. In the DSP 4, each supplied coefficient is set as a coefficient for the multiplier (see FIG. 3) of each EQ element.

In the next step S119, a process is performed for computing characteristics after correction. That is, in step S119, on the basis of the determination value of each EQ element, which is determined finally, the frequency-amplitude characteristics when the parameter of each EQ element is set are computed as "characteristics after correction".

In step S120, the characteristics after correction are set as new target characteristics. That is, in this embodiment, in the subsequent processing, object characteristics of another channel other than object characteristics Tks-1 are made to match characteristics after correction of Ach. For this purpose, the target characteristics are set to characteristics after correction of Ach, which are newly computed, rather than to the line of 0 dB.

Figure 10:
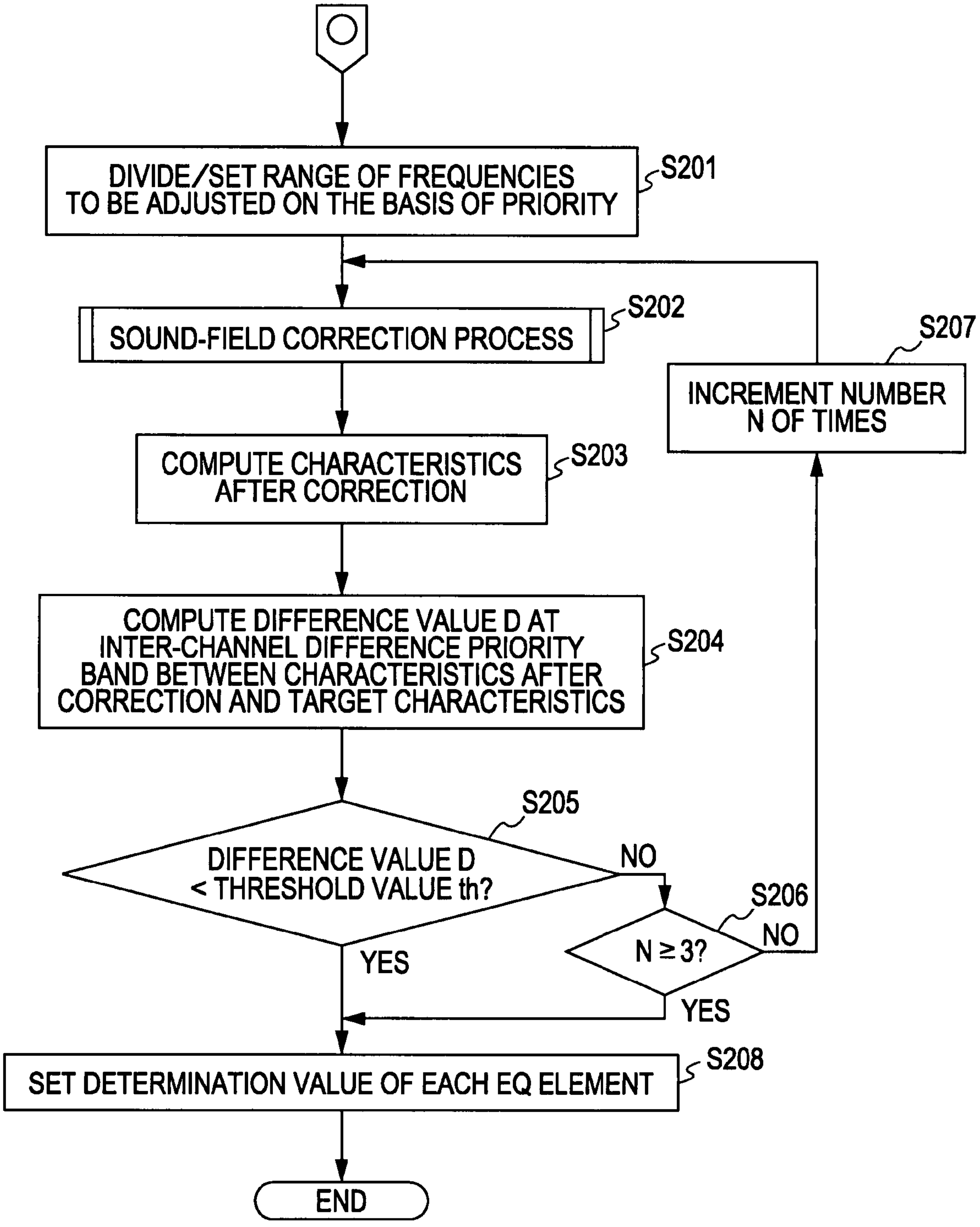
FIG. 10 is a flowchart illustrating a processing operation for realizing correction for another channel, including a sound-field correction process, according to the embodiment of the present invention.

When the characteristics after correction for the first channel (Ach) are set as the target characteristics in step S120, the process proceeds to FIG. 10, and a process is performed for causing the frequency-amplitude characteristics of Bch to match the target characteristics.

At first, in step S201, the range X of frequencies to be adjusted is divided/set on the basis of the priority. That is, as described above with reference to FIGS. 7A and 7B and FIG. 8, a portion of lower frequencies of the range X of frequencies to be adjusted is set as an inter-channel difference priority band and furthermore, the inter-channel difference priority band is divided into two areas, that is, an area with a high correction priority and an area with a low correction priority. The "priority" referred to herein refers to a degree at which, as was also described above, a correction computation process is necessary to reduce the distortion of a sound image.

In the subsequent step S202, a sound-field correction process is performed.

A description will be given below, with reference to the flowchart in FIG. 11, of the processing operation for a sound-field correction process in step S202 of FIG. 10.

Figures 11, 11A:
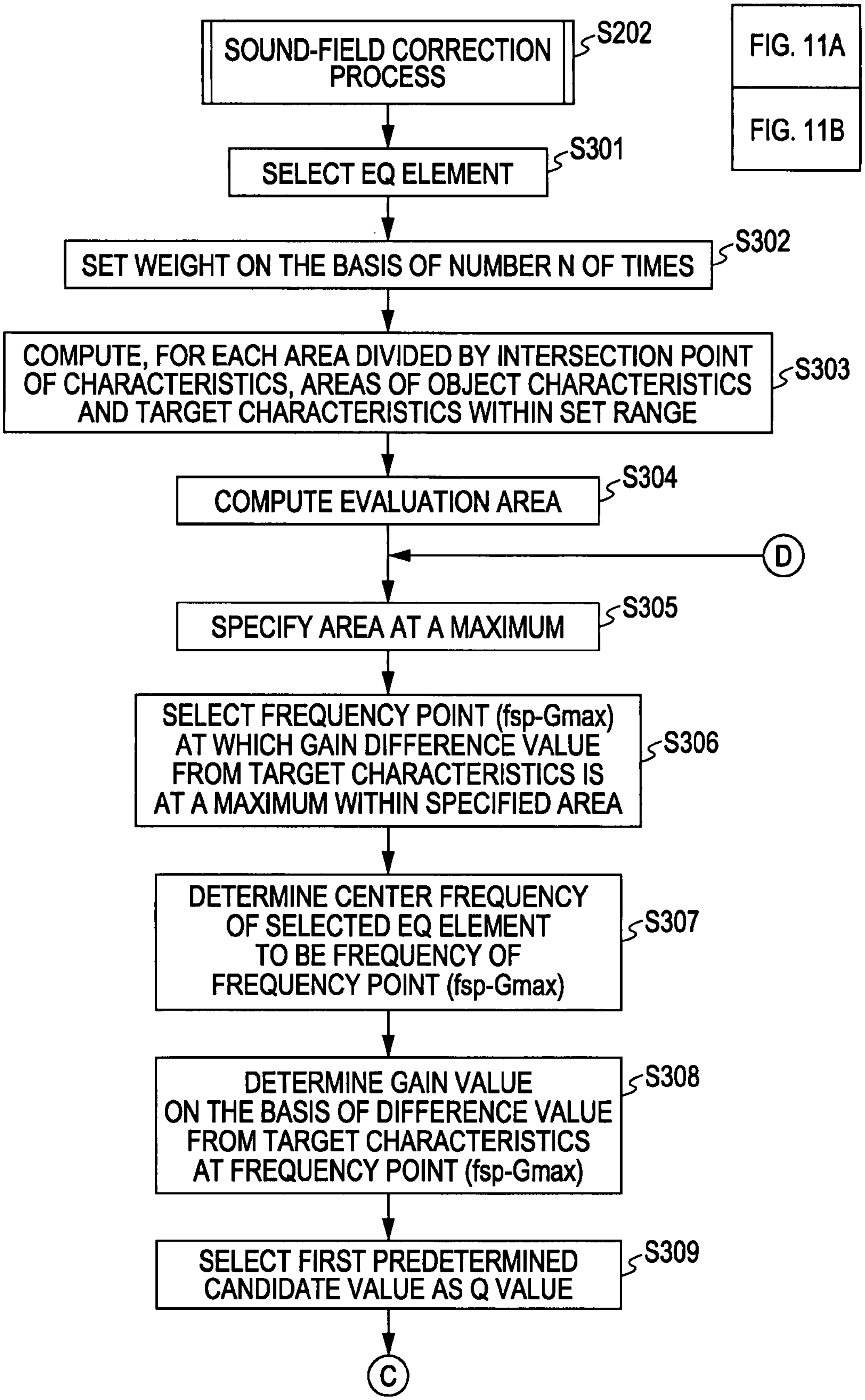
FIG. 11 is a flowchart illustrating a processing operation for realizing a sound-field correction processing operation according to the embodiment of the present invention.
Figure 11B:
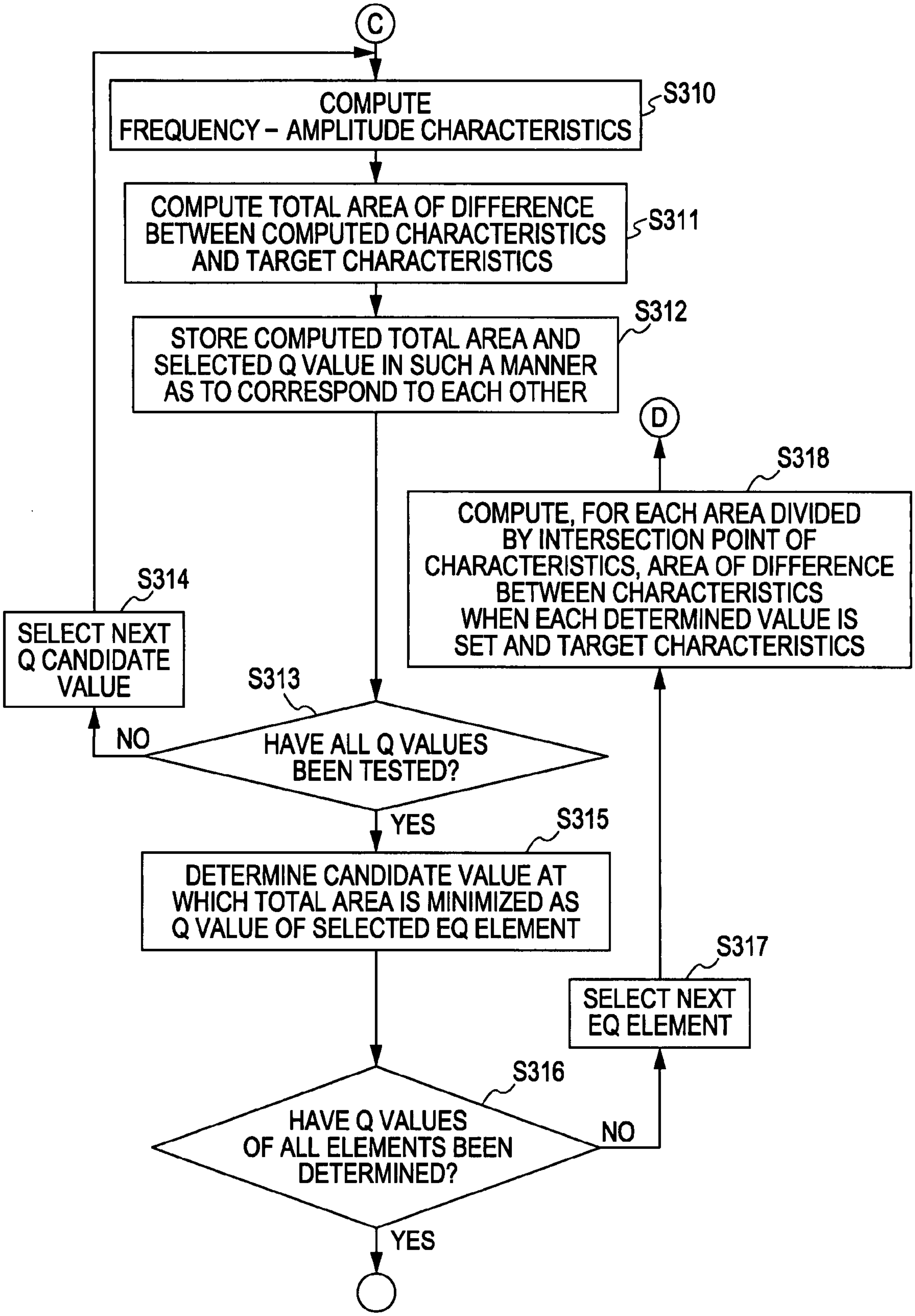

With reference to FIG. 11, at first, in step S301, an EQ element is selected similarly to step S102 in FIG. 9. When a sound-field correction process is to be performed, in the initialization, the number N of times is set to 1.

In the next step S302, a weight based on the number N of times is set. That is, as described above with reference to FIG. 7, a weight based on the number of times is set in an area that is formed by both the frequency-amplitude characteristics of Ach and Bch, which is at the inter-channel difference priority band.

In step S303, the areas of the object characteristics and the target characteristics are computed for each area divided by an intersection point of characteristics within the set range. That is, when correction is performed earlier for Ach, flat characteristics are used as target characteristics. When correction is performed for Bch, since the characteristics after correction for Ach are used as target characteristics, flat characteristics are not always used. Therefore, the area is computed on the basis of the area, which is a reference, divided by the intersection point of both the characteristics after correction of Ach and the target characteristics of Bch, rather than on the basis of the area divided by the insufficient-gain portion/the excess-gain portion as in the above-described case of performing correction for Ach.

In the next step S304, with regard to the area within the inter-channel difference priority band, an area in which a weight is set to the size of the area, which is computed in step S303, is computed, and this is newly set as an evaluation area.

The processing from the next step S305 up to step S317 is the same as the processing from step S104 of FIG. 9 described above up to step S116. Accordingly, a detailed description of the processing is omitted.

However, the process of step S318 differs from step S117 described above, and the target characteristics in this case are not flat characteristics, but are characteristics after correction for Ach. Therefore, similarly to step S303, the area of the difference with the target characteristics is computed for each area divided by the intersection point of the respective characteristics.

The description returns to FIG. 10.

When the above-described process is performed as the sound-field correction process in step S202, the process proceeds to the next step S203.

In step S203, the characteristics after correction are computed. That is, the frequency-amplitude characteristics obtained when the parameter of each EQ element obtained by the sound-field correction process in step S202 described above is set to each equalizer for Bch are calculated, and they are computed as the characteristics after correction of Bch.

In step S204, a difference value D at the inter-channel difference priority band between the characteristics after correction and the target characteristics is computed. That is, with regard to both the characteristics after correction of Bch, which are computed in step S203, and the target characteristics of Ach, the difference value D in the range of the inter-channel difference priority band is computed.

In the next step S205, a process is performed for determining whether or not the computed difference value D is smaller than a threshold value th, That is, in order to decrease the difference area of both the frequency-amplitude characteristics between Ach having target characteristics and Bch having the characteristics after correction at the inter-channel difference priority band, the difference value D is compared with the threshold value th that is set in advance in the CPU, and a process of determining whether or not the computed difference value D is smaller than the threshold value th is performed.

When it is determined in step S205 that the difference value D between the frequency-amplitude characteristics of Ach, which are the target characteristics, and the frequency-amplitude characteristics of Bch, which are the characteristics after correction in this case, is not smaller than the threshold value th, the process proceeds to step S206, where a process is performed to determine whether or not the number of times the sound-field correction process has been performed is three or more. That is, in this embodiment, when it is determined that the difference value D at the inter-channel difference priority band is not smaller than the predetermined value, a correction computation process is performed further. However, even if the correction computation process is repeated a fixed number of times or more, there is a case in which much improvement in the correction of the distortion of the sound image is not seen. Therefore, in this embodiment, as a measure, the upper limit of the number of times the correction computation process is performed is set as, for example, three, and four or more correction computation processes are not performed.

When it is determined in step S206 that the number of times the sound-field correction process has been performed is 2 or less times, the process proceeds to step S207, where the number N of times of the execution of the sound-field correction process is incremented by 1.

Thereafter, the process returns from step S206 to step S202, where the loop process from step S202 to step S206 is repeated as long as the difference value D is greater than or equal to the threshold value th and the number N of times of the sound-field correction process is less than 3.

On the other hand, when it is determined in step S204 that the difference between the frequency-amplitude characteristics of Ach, which are target characteristics, and the frequency-amplitude characteristics of Bch, which are characteristics after correction, is smaller than the predetermined threshold value th within the inter-channel difference priority band, or when it is determined in step S205 that the number of times the sound-field correction process has been performed is greater than or equal to 3, the process proceeds to step S208, where a process for setting the determination value of each EQ element is performed. That is, in the manner described above, a coefficient used to set each value for each determined EQ element is supplied to the DSP 4. In the DSP 4, each of the supplied coefficients is set as a coefficient of the multiplier (see FIG. 3) of each EQ element.

Figure 12:
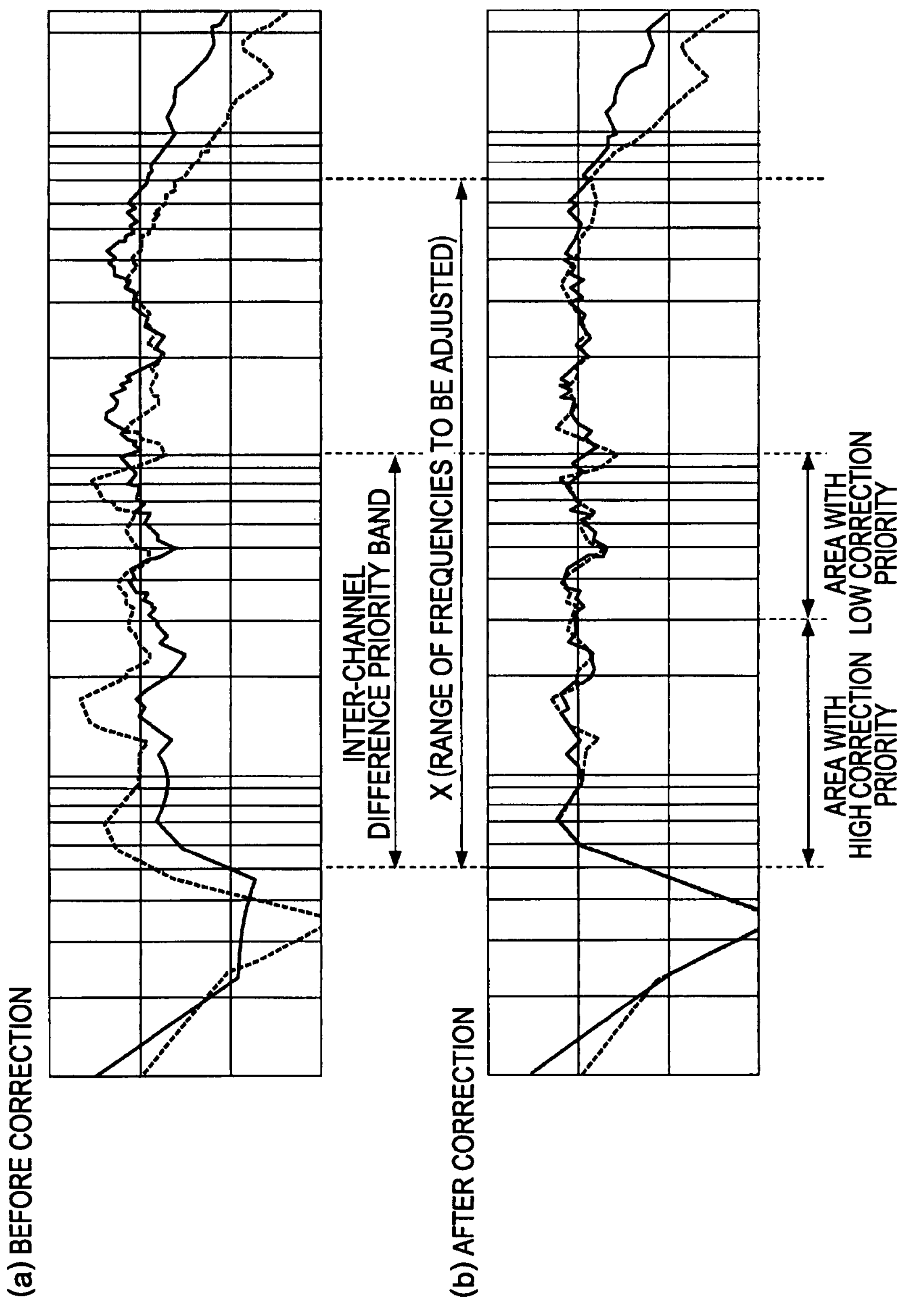
FIG. 12 shows frequency-amplitude characteristics before correction and after correction for each of a certain channel and another channel according to the embodiment of the present invention.

FIG. 12 shows an example of actual correction in this embodiment. In FIG. 12, the frequency-amplitude characteristics of only two channels among four channels are shown. The channel that is corrected first may be represented as Ach, and the remaining three channels may be represented each as Bch.

Part (a) of FIG. 12 shows frequency-amplitude characteristics of Ach and Bch before correction. The difference in the frequency-amplitude characteristics between the two channels is large in not only the range X of frequencies to be adjusted, but also in the range other than that.

Part (b) of FIG. 12 shows frequency-amplitude characteristics of Ach and Bch after correction. The difference in the frequency-amplitude characteristics between the two channels is smaller in the entire range X of frequencies to be adjusted when compared with that before correction, and in particular, in the range of the area with a high correction priority, the difference in the characteristics between the two channels is very small.

In the manner described above, since the difference between two channels at the inter-channel difference priority band positioned at a low frequency band, particularly, in the area with a high correction priority can be decreased, regarding audio output from the right and left speakers SP, the distortion of a sound image can be satisfactorily reduced.

Up to this point, the embodiment of the present invention has been described. However, the present invention is not limited to the above-described embodiment, and various modifications are possible.

For example, in this embodiment, a correction process is performed as follows. A certain speaker SP-FL among 4 speakers SP (SP-FR, SP-FL, SP-RR, and SP-RL) is represented as Ach. First, correction for bringing the frequency-amplitude characteristics of Ach closer to flat characteristics is performed. Thereafter, frequency-amplitude characteristics of audio output from the remaining three speakers SP (SP-FR, SP-RR, and SP-RL) are brought to the characteristics after correction of Ach.

In addition, after correction for bringing the frequency-amplitude characteristics of Ach (the speaker SP-FL) to flat characteristics is performed, the frequency-amplitude characteristics of audio output from the speaker SP-FR and the speaker SP-RL are brought closer to the characteristics after correction of Ach, and only the frequency-amplitude characteristics of audio output from the remaining speaker SP-RR may be brought closer to the characteristics after correction of the channel of the speaker SP-RL.

Also, as a result of the above, the frequency-amplitude characteristics of audio output from the right and left and front and rear speakers SP can be brought closer to each other. Thus, the advantages of this embodiment such that the distortion of a sound image can be reduced and a higher sense of realism can be obtained can be obtained in a similar manner.

The description thus far is presupposed that a correction process for decreasing the difference in the characteristics between the front and rear channels is performed by considering the problem of a sense of realism resulting from the difference in the frequency-amplitude characteristics between the front and rear channels. For example, when a problem on such a sense of realism is not considered, a correction process can also be performed independently on the front side and on the rear side.

That is, with regard to a speaker SP on the front side, a correction process is performed so that, for example, the speaker SP-FR has characteristics closer to predetermined characteristics (for example, flat characteristics), and a correction process is performed on the speaker SP-FL by using the characteristics after correction of the speaker SP-FR as target characteristics. Furthermore, regarding the speaker SP on the rear side, for example, after a correction process is performed so that the speaker SP-RR has characteristics closer to predetermined characteristics in a similar manner, a correction process is performed for the speaker SP-RL by using the characteristics after correction of the speaker SP-RR as target characteristics.

Also when a correction process is performed for one of the channels by using predetermined characteristics as target characteristics and a correction process is performed for the other channel by using the characteristics after correction as target characteristics independently on the front side and on the right side in the manner described above, similarly to the case of the embodiment, distortion of a sound image resulting from the difference in the frequency-amplitude characteristics of the right and left speakers SP can be reduced.

Furthermore, in this embodiment, four speakers SP (SP-FR, SP-FL, SP-RR, and SP-RL) among a total of 6 speakers SP shown in FIG. 2 are made to be objects to be corrected. However, when the number of speakers provided is different, in response, the number of speakers SP to be corrected can be changed.

Regarding a weight coefficient, it is increased by a fixed level in a step-like manner each time the number of correction computation processes is increased. As another example of weighting, when a third correction computation process is to be performed, a coefficient larger than that when the second correction computation process was performed is also considered to be set in the weight coefficient. When the second and third correction computation processes are to be performed, a numeric value differing from the weight coefficient ("1.5" in this embodiment) may be set in this embodiment is set and may be increased by a fixed level.

Furthermore, as an equalizer element, a GEQ may be used. At this point, when correction is to be performed with a lesser number of elements using a PEQ, it is difficult to equally perform correction in the entire area. By setting the center frequency after several frequency points are selected, it is necessary to deal with one of the areas with a higher priority. On the other hand, when correction is performed using a GEQ, since the center frequency is fixed, it is difficult to apply the concept such that a certain frequency point is selected and correction is performed by giving a priority to a specific area as in the case of using a PEQ.

For this reason, when correction is performed using a GEQ, only the concept of performing gain adjustment so that the characteristics are brought closer to the object characteristics by using the characteristics after correction of Ach as target characteristics may be applied.

Frequency points are provided at a total of 31 places. The number of frequency points to be set can be increased or decreased than that.

In this embodiment, the upper limit of the correction computation process is set at three times, but a limitation may not be provided on the number of times. Furthermore, a weight may be provided starting from the first correction process.

In this embodiment, in the process of determining the Q value of an EQ element when correction is performed by using characteristics after correction of Ach as target characteristics, the range in which frequency-amplitude characteristics when each Q candidate value is set are evaluated is set to be the entire range X of frequencies to be adjusted. Instead, the range can also be set to be an inter-channel difference priority band.

It should be understood by those skilled in the art that various modifications, combinations, sub-combinations and alterations may occur depending on design requirements and other factors insofar as they are within the scope of the appended claims or the equivalents thereof.

What is claimed is:

1. A signal processing apparatus comprising:

a plurality of multiband equalizers, each configured to receive an audio signal from among a plurality of audio signals for a plurality of respective audio channels, and each of the multiband equalizers configured to perform at least gain adjustment in a plurality of frequency bands for a received audio signal;

a plurality of output means, each for a respective channel of the plurality of audio channels and each configured to output a respective sound signal from a respective audio signal by a respective multiband equalizer;

measurement means for measuring frequency-amplitude characteristics of each sound signal output from the plurality of output means; and computation means for performing a computation process for correcting the measured frequency-amplitude characteristics, wherein the computation means is configured to compute at least one first parameter to be set for a first multiband equalizer of a respective first channel so that the corrected frequency-amplitude characteristics for the first channel, more closely match predetermined first target characteristics, and wherein the computation means is further configured to use the corrected frequency-amplitude characteristics as second target characteristics for channels other than the first channel, and is further configured to compute at least one second parameter to be set for a second multiband equalizer of a respective second channel so that corrected frequency-amplitude characteristics of the second channel more closely match the second target characteristics.

2. The signal processing apparatus according to claim 1, wherein each of the plurality of multiband equalizers comprises a parametric equalizer that can change a center frequency, a gain value, and a degree of sharpness.

3. The signal processing apparatus according to claim 2, wherein, for channels other than the first channel, the computation means is further configured to identify a priority band within the band of frequency-amplitude characteristics and then perform the computation process for correcting the frequency-amplitude characteristics by giving higher priority to the priority band.

4. The signal processing apparatus according to claim 3, wherein the computation means is further configured to make an evaluation of whether a difference between the frequency-amplitude characteristics of the first channel and those of the channels other than the first channel is smaller than or equal to a predetermined value within the priority band, and performs a correction computation process again by changing a weighting factor of the priority band when the difference in the frequency-amplitude characteristics is not smaller than or equal to the predetermined value.

5. A signal processing method for use with a signal processing apparatus including a plurality of multiband equalizers, each configured to receive an audio signal from among a plurality of audio signals for a plurality of respective audio channels and further configured to perform at least gain adjustment in a plurality of frequency bands for a received audio signal; a plurality of output means, each for a respective channel of the plurality of audio channels, each for outputting a respective sound signal from a respective audio signal processed by a respective multiband equalizer; and measurement means for measuring frequency-amplitude characteristics of each sound signal output from the plurality of output means, the signal processing method comprising the steps of:

computing at least one first parameter to be set for a first multiband equalizer of a respective first channel so that corrected frequency-amplitude characteristics for the first channel more closely match predetermined first target characteristics;

measuring, with the measurement means, the corrected frequency-amplitude characteristics for the first channel as second target characteristics and computing at least one second parameter to be set for a second multiband equalizer of a respective second channel so that corrected frequency-amplitude characteristics of the second channel more closely match the second target characteristics.

6. A recording medium having a program recorded thereon, the program to be executed by a signal processing apparatus including a plurality of multiband equalizers, each configured to receive an audio signal from among a plurality of audio signals for a plurality of respective audio channels and further configured to perform at least gain adjustment in a plurality of frequency bands for a received audio signal; a plurality of output means, each for a respective channel of the plurality of audio channels, each for outputting a respective sound signal from a respective audio signal processed by a respective multiband equalizer; and measurement means for measuring frequency-amplitude characteristics of each sound signal output from the plurality of output means, and the program comprising the steps of:

computing at least one first parameter to be set for a first multiband equalizer of a respective first channel so that corrected frequency-amplitude characteristics for the first channel, more closely match predetermined first target characteristics measuring, with measurement means, the corrected frequency-amplitude characteristics for the first channel as second target characteristics and computing at least one second parameter to be set for a second multiband equalizer of a respective second channel so that corrected frequency-amplitude characteristics of the second channel more closely match the second target characteristics.

7. A signal processing apparatus comprising:

a plurality of multiband equalizers, each configured to receive an audio signal from among a plurality of audio signals for a plurality of respective audio channels, and each of the multiband equalizers configured to perform at least gain adjustment in a plurality of frequency bands for a received audio signal;

a plurality of respective output sections, each configured to output a respective sound signal for a respective audio channel from a respective audio signal processed by a respective multiband equalizer;

a measurement section configured to measure frequency-amplitude characteristics of each sound signal output from the plurality of output sections; and a computation section configured to perform a computation process for correcting the measured frequency-amplitude characteristics, wherein the computation section is configured to compute at least one first parameter to be set for a first multiband equalizer of a respective first channel so that the corrected frequency-amplitude characteristics for the first channel more closely match predetermined first target characteristics, and wherein the computation section is further configured to use the corrected frequency-amplitude characteristics as the as second target characteristics for channels other than the first channel, and is further configured to compute at least one second parameter to be set for a second multiband equalizer of a respective second channel so that corrected frequency-amplitude characteristics of the second channel more closely match the second target characteristics.

* * * * *